United States Patent
Seno et al.

(10) Patent No.: US 6,924,679 B2
(45) Date of Patent: Aug. 2, 2005

(54) POWER SUPPLY CONTROL DEVICE, SEMICONDUCTOR DEVICE AND METHOD OF DRIVING SEMICONDUCTOR DEVICE

(75) Inventors: Katsunori Seno, Kanagawa (JP); Akihiko Hashiguchi, Kanagawa (JP); Tetsuo Kondo, Tokyo (JP); Takahiro Seki, Kanagawa (JP)

(73) Assignee: Sony Corporation (JP)

( * ) Notice: Subject to any disclaimer, the term of this patent is extended or adjusted under 35 U.S.C. 154(b) by 329 days.

(21) Appl. No.: 09/959,997

(22) PCT Filed: Mar. 13, 2001

(86) PCT No.: PCT/JP01/01930
§ 371 (c)(1),
(2), (4) Date: Apr. 23, 2002

(87) PCT Pub. No.: WO01/71445
PCT Pub. Date: Sep. 27, 2001

(65) Prior Publication Data
US 2002/0190283 A1 Dec. 19, 2002

(30) Foreign Application Priority Data

| Mar. 17, 2000 | (JP) | 2000-081833 |
|---|---|---|
| Mar. 28, 2000 | (JP) | 2000-092962 |
| Jul. 21, 2000 | (JP) | 2000-221137 |
| Jan. 25, 2001 | (JP) | 2001-017529 |

(51) Int. Cl.[7] ............................................. H03L 7/06
(52) U.S. Cl. ...................................................... 327/158
(58) Field of Search ................................. 327/156, 158, 327/161, 530, 538

(56) References Cited
U.S. PATENT DOCUMENTS 5,585,754 A  12/1996  Yamashina et al. ......... 327/158
5,914,631 A  6/1999  Soneda ......................... 327/535
6,166,562 A  12/2000  Mita et al. ..................... 326/83
6,414,527 B1 *  7/2002  Seno et al. .................... 327/158

FOREIGN PATENT DOCUMENTS

| EP | 1008923 A1 | 6/2000 |
| EP | 1164454 A1 | 12/2001 |

(Continued)

OTHER PUBLICATIONS

Supplementary Partial European Search Report dated May 5, 2003.

*Primary Examiner*—Quan Tra
(74) *Attorney, Agent, or Firm*—Rader, Fishman & Grauer PLLC; Ronald P. Kananen

(57) ABSTRACT

A power supply voltage control apparatus including an input signal generation circuit of wide uses or a small-sized monitor circuit of a novel configuration, and a semiconductor circuit and a method for driving the same, having a semiconductor circuit 11, an input signal generation circuit 12 able to change the phase difference i of a reference signal out$\phi$i and an input signal out$\phi$0 in accordance with a control signal Si when generating the two signals from a clock, a monitor circuit 13 having a characteristic between a power supply voltage and delay the same as that of a critical path of the semiconductor circuit 11, propagating the input signal out$\phi$0, and outputting a delayed signal out$\phi$0' to be delayed exactly by a time equivalent to a delay of the critical path (or smaller by a constant ratio), a delay detection circuit 14 for detecting a delay of the delayed signal out$\phi$0' relative to the reference signal out$\phi$i, and a power supply voltage control circuit 15 for controlling a power supply voltage $V_{DD}$ supplied to the semiconductor device 11 and the monitor circuit 13 based on the detection result.

23 Claims, 28 Drawing Sheets

FOREIGN PATENT DOCUMENTS

| | | |
|---|---|---|
| JP | 4-160519 | 6/1992 |
| JP | 04160519 A | 6/1992 |
| JP | 7-264056 | 10/1995 |
| JP | 10-49242 | 2/1998 |
| JP | 10-242831 | 9/1998 |
| JP | 11174125 A | 7/1999 |
| JP | 11296243 A | 10/1999 |
| JP | 2000020148 A | 1/2000 |
| JP | 2000036741 A | 2/2000 |
| JP | 2000066746 A | 3/2000 |
| JP | 2000133772 A | 5/2000 |
| JP | 2000214221 A | 8/2000 |
| JP | 2000216338 A | 8/2000 |
| JP | 2000295084 A | 10/2000 |
| JP | 20010360087 A | 2/2001 |
| JP | 2001-156261 | 6/2001 |
| WO | WO 98/06022 | 2/1998 |

\* cited by examiner

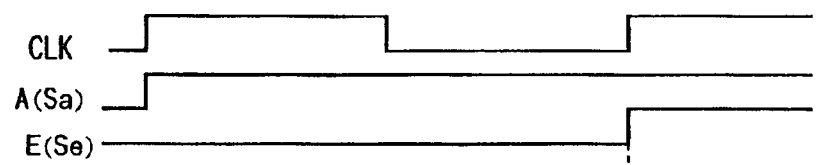
FIG.8A
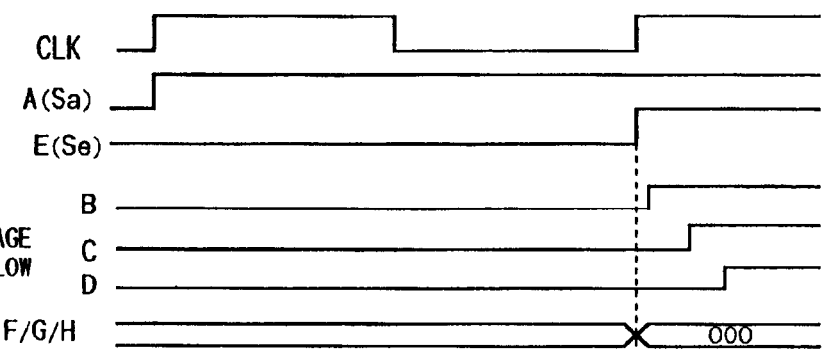
FIG.8B VOLTAGE TOO LOW
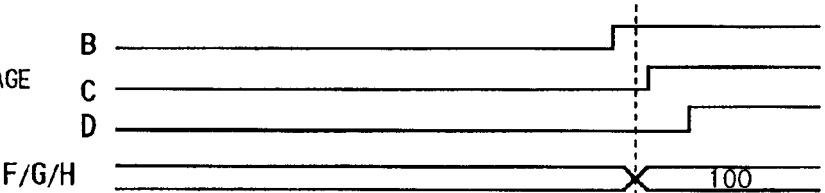
FIG.8C VOLTAGE LOW
FIG.8D VOLTAGE APPROPRIATE
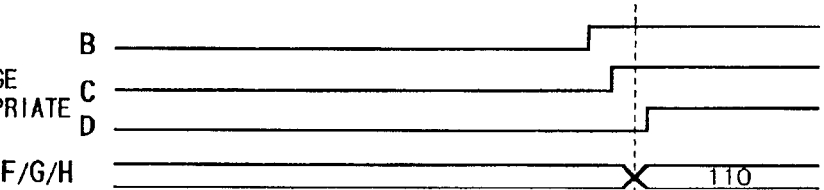
FIG.8E VOLTAGE HIGH
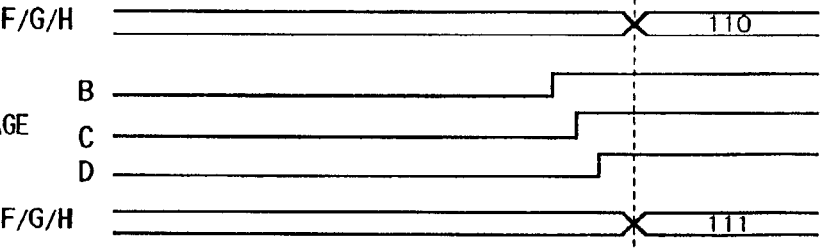
FIG.8F

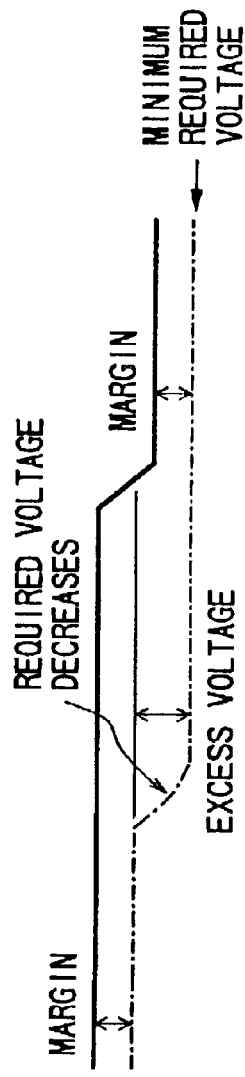

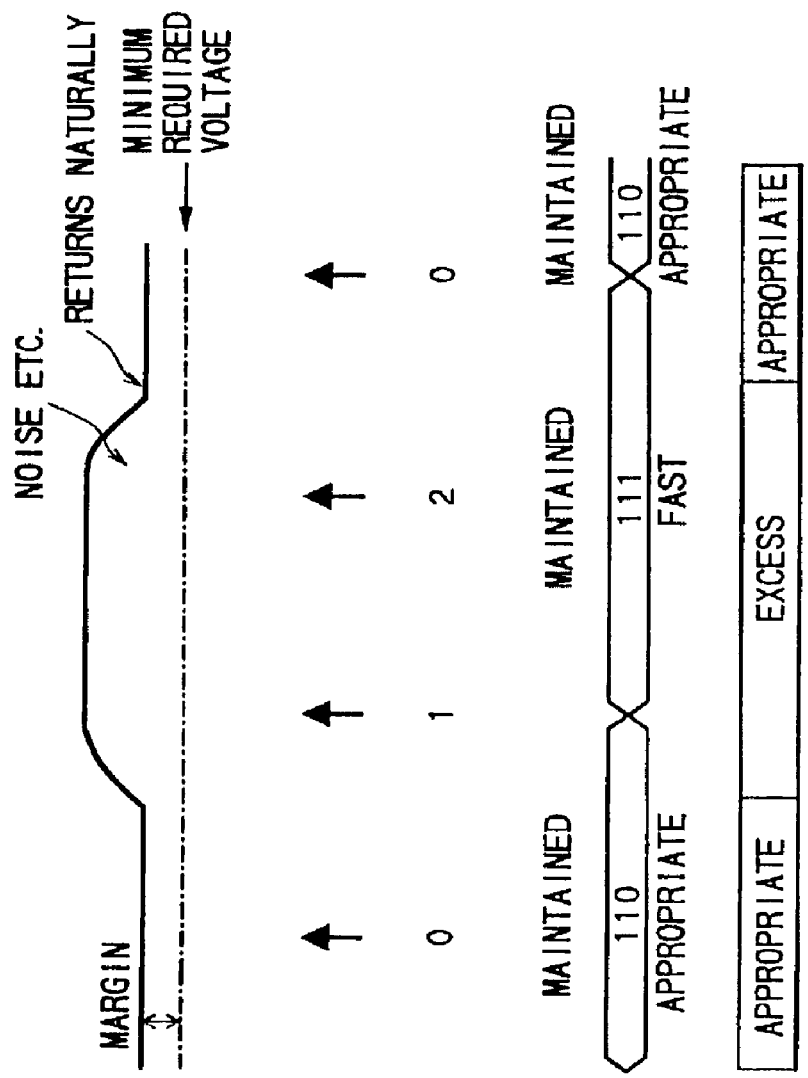

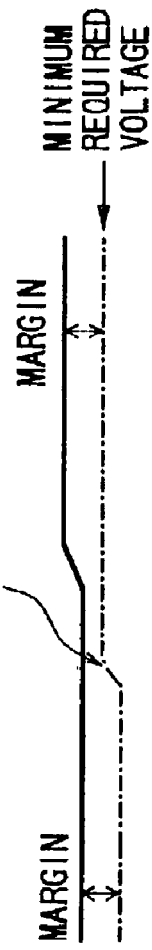
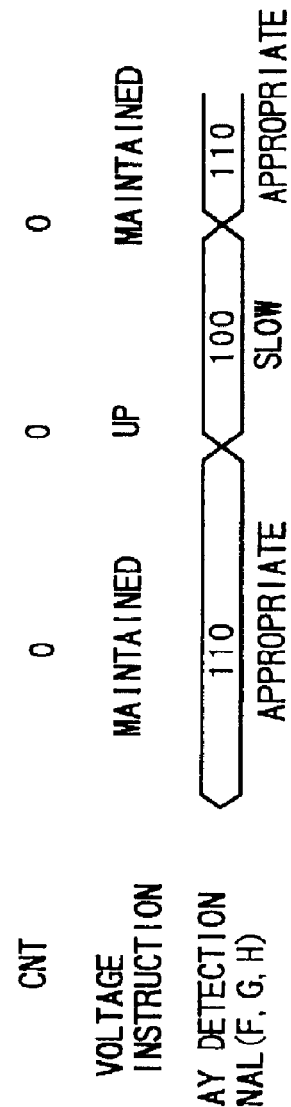
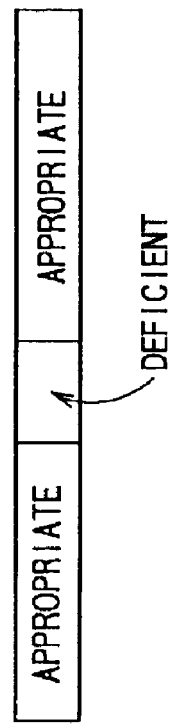
FIG.13A
FIG.13B
FIG.13C

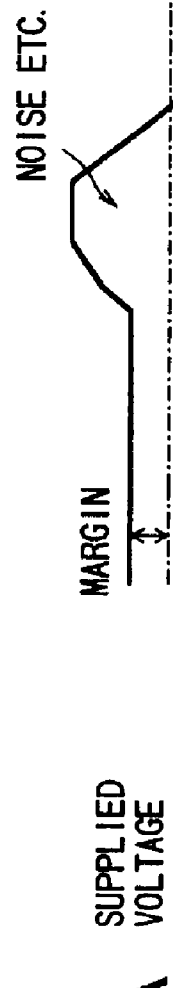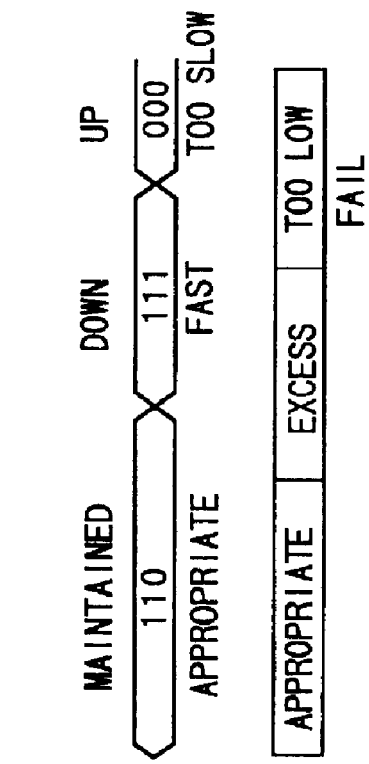

332

FIG.18A  S32   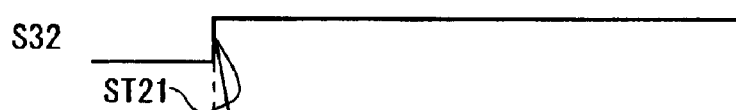
FIG.18B  S333  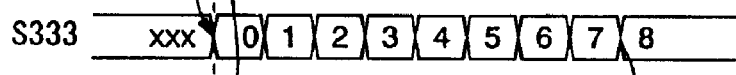
FIG.18C  S332  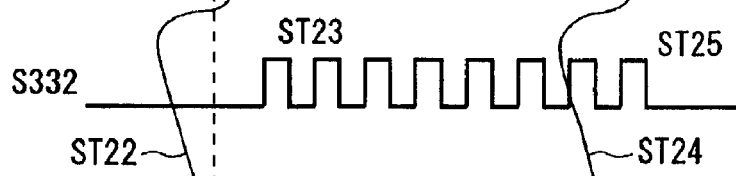
FIG.18D  S331  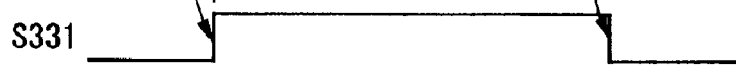
FIG.18E  S33   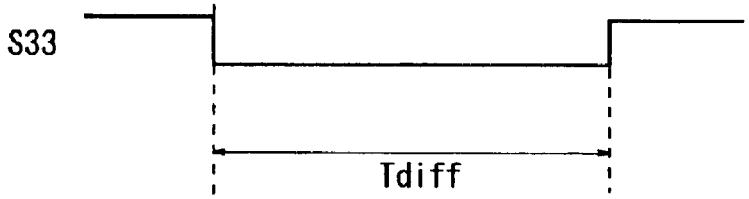

PRIOR ART
FIG.27A S1 
FIG.27B S3A 
FIG.27C S2 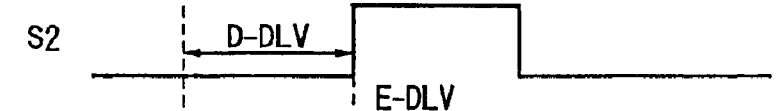
FIG.27D S3B 

POWER SUPPLY CONTROL DEVICE, SEMICONDUCTOR DEVICE AND METHOD OF DRIVING SEMICONDUCTOR DEVICE

TECHNICAL FIELD

The present invention relates to a power supply voltage control apparatus including a monitor circuit for obtaining a delay characteristic of a critical path in a semiconductor circuit or other target circuit and a semiconductor device and method of driving the same.

BACKGROUND ART

To respond to demands for reducing the power consumption of semiconductor integrated circuits (LSI) in recent years, it has been proposed to control the power supply voltage dynamically to deal with the variability in operation frequencies of LSI's and processes and to supply the minimum limit of voltage enabling an LSI to operate normally.

In a power supply voltage control apparatus adopting such a so-called variable power supply voltage control system, as shown in FIG. 26, in order to monitor the delay time of a critical path of the LSI 1, for example, a monitor circuit having a characteristic between a power supply voltage and delay equivalent to that of the critical path is provided, and the power supply voltage is controlled so that the signal propagation speed of the monitor circuit 2 enters a predetermined appropriate range.

Specifically, the power supply voltage control apparatus shown in FIG. 26 includes an input signal generation circuit 3 for generating an input pulse S1 to the monitor circuit 2 and a reference pulse S2 for delay detection, a delay detection circuit 4 for comparing the phases of an output pulse S3 obtained by propagation of the input pulse S1 by the monitor circuit 2 with the reference pulse S2, and a power supply voltage control circuit 5 for receiving the detection result of the delay detection circuit 4, generating a new power supply voltage by this, and switching the power supply voltage that had been supplied to the LSI 1 and the monitor circuit 2 to the new power supply voltage.

In an actual power supply voltage control circuit 5, for example, a voltage generation circuit 6 is configured by a DC—DC converter, and a processor or other control circuit 7 controls the program.

FIG. 27 gives views of various signal waveforms during operation of the power supply voltage control apparatus.

Here, FIG. 27A shows the input signal S1 (input pulse) of the monitor circuit 2 generated by the input signal generation circuit 3.

FIG. 27C shows the reference signal S2 (delay detection input) generated by the input signal generation circuit 3.

Further, FIG. 27B and FIG. 27D show the output signals S3A and S3B (monitor output A, B) output by propagation and delay of the input signal S1 in the monitor circuit 2. Among these, the monitor output S3A of FIG. 27B shows the case where the delay of the monitor circuit 2 is smaller than the reference value, while the monitor output S3B of FIG. 27D shows the case where the delay of the monitor circuit 2 is larger than the reference value.

In addition, M-DLV in FIG. 27B and FIG. 27D indicates a delay value of the monitor circuit, L-DLV a lacking delay value, and E-DLV an excess delay value, respectively, while the D-DLV in FIG. 27C indicates a desired delay value.

FIG. 28 is a flow chart showing the operation routine of the power supply voltage control apparatus.

Below, the operation of the power supply voltage control apparatus of FIG. 26 will be explained with reference to the waveform diagram of FIG. 27 and the flow chart of FIG. 28.

First, at step ST1, the input signal generation circuit 3 acting as a pulse generation circuit for example generates the input pulse (input signal) S1 and the delay detection input (reference pulse) based on an input system clock.

The input pulse S1 and the reference pulse S2 may be periodic signals having a constant phase difference or something like one-shot pulses or may be periodic signals of a duty ratio of 50%. It is sufficient that the frequency be lower than the system clock to a certain extent and that there be a constant delay value between them.

The reference pulse S2 is directly sent to one input of the delay detection circuit 4, while the input pulse S1 is delayed by a certain time in the monitor circuit 2 and then sent to the other input of the delay detection circuit 4.

Then, at step ST2, the delay detection circuit 4 detects the signal delay of the monitor circuit 2 based on the pulse S2 that does not pass the monitor circuit 2.

For example, it detects if the rising edge of the pulse of the output signal (monitor output) S3 of the monitor circuit 2 is earlier or later than the rising edge of the reference signal S2.

If the result of the delay detection, as shown in FIG. 27B, if the signal delay of the monitor circuit 2 is smaller than a lower limit of an appropriate range defined by the reference pulse S2, at step ST3, the control circuit 7 issues a request to lower the supplied voltage, and the voltage generation circuit 6 generates a lower power supply voltage $V_{DD}{}'$ and switches it with the power supply voltage $V_{DD}$ supplied until then.

Conversely, as shown in FIG. 27D, if the signal delay value of the monitor circuit 2 is larger than an upper limit of the appropriate range, at step ST4, the control circuit 7 issues a request to increase the supplied voltage, and the voltage generation circuit 6 generates a higher power supply voltage $V_{DD}{}'$ and switches it with the power supply voltage $V_{DD}$ supplied until then.

On the other hand, if the signal delay value is in the appropriate range, at step ST5, the power supply voltage $V_{DD}$ supplied so far is maintained.

The delay detection and the voltage control are carried out each time the reference pulse S2 is input, while feedback control is performed constantly.

The reference pulse S2 defines the upper limit of the appropriate range. Immediately after the delay value becomes larger than the reference pulse S2, the operation of increasing the supplied voltage is executed. On the other hand, the delay detection output includes information enabling determination of the magnitude of the excess delay, so the control circuit 7 issues a request for decreasing the supplied voltage when the delay value is smaller than a time obtained by subtracting a certain delay margin from the rising edge of the reference pulse S2.

In the power supply voltage control apparatus, the monitor circuit 2 is given a characteristic between a power supply voltage and delay equivalent to that of the critical path in the semiconductor circuit of the LSI 1. Therefore, it is possible to control the power supply voltage $V_{DD}$ to track the voltage level of the minimum limit of voltage required so that normal operation can be secured by the critical path plus a certain margin. Due to this, the power consumption is suppressed to the minimum limit.

In addition, in the conventional power supply voltage control apparatus, control feedback is made to operate in the minimum time required from the time when the delay detection circuit 4 detects a delay of the monitor circuit 2 so as to obtain a high control response.

In this conventional power supply voltage control apparatus, the delay value of the reference signal S2 relative to the input signal S1 is a constant, for example, one period's worth of the system clock signal. Because the delay value of the reference signal S2 is required to be set in the range where the delay value of the monitor circuit 2 changes, in the past, it was necessary to redesign even the input signal generation circuit 3 acting as a pulse generation circuit for each monitor circuit 2. As a result, this had become one factor increasing the burden in design and development of power supply voltage control apparatuses.

On the other hand, the monitor circuit 2 used in the conventional power supply voltage control apparatus had been designed to obtain a characteristic between a power supply voltage and delay equivalent to that of the critical path of an LSI. Therefore, when the delay value of the critical path of an LSI was large, the conventional monitor circuit for reproducing the delay characteristic included a large number of gate elements etc. and became large in size. Therefore, if the area of the power supply voltage control apparatus was large and this apparatus was integrated into an LSI, the cost of the LSI ended up rising.

Further, in the above power supply voltage control apparatus, for example, the output of a DC—DC converter or other source for supplying the power supply voltage sometimes fluctuates for a very short time because of noise etc. In this case, the signal propagation speed of the monitor circuit 2 receiving the supplied power rises for a while. As a result, the control circuit 7 issues a request for decreasing the power supply voltage.

After the power supply voltage is detected, however, it takes a certain amount of time before the control actually works, so when a power supply voltage lower than before is output by the voltage generation circuit 6 receiving the request of the control circuit 7, the variation in the power supply voltage sometimes already calms down. In this case, the power supply voltage has been lowered even though was not necessary, so the power supply voltage supplied to the semiconductor circuit is liable to fall below the minimum operating voltage required for the circuit to operate normally.

To lower this risk, it is enough to set a certain margin for the minimum operating voltage of the level of the control target of the power supply voltage. This voltage margin, for example, is defined by the difference of the amount of delay detected by the delay detection circuit 4 during normal operation and the delay serving as a reference for the start of control.

The minimum operating voltage of a semiconductor circuit can change due to the ambient temperature of the surroundings, but even if the minimum operating voltage changes, if tracking the change at all times using a level added with a sufficiently large constant margin as a control target of the power supply voltage, it is possible to prevent the operating voltage of the semiconductor circuit from becoming lower than the lower limit.

If the margin of the power supply voltage is made too large, however, the inherent effect of the power supply voltage control apparatus, that is, to supply the minimum limit of power supply voltage required so as to reduce the power consumption, ends up being weakened.

The condition required in a monitor circuit 2 in an apparatus configured as shown in FIG. 26 is that it be configured to give a desired delay value becoming a delay value equal to that of the critical path.

As a method for configuring such a monitor circuit, there is the method in which the critical path of a target circuit is extracted for configuration or the method in which a multistage string of delay elements is used for configuration.

However, in the former method in which the critical path of the target circuit itself is extracted for configuration, it is extremely difficult to extract a complicated critical path from a target circuit itself by path analysis. The critical path extracted by such work does not always match the critical path of a target circuit actually formed. In addition, work of extracting a critical path from the massive results of path analysis results is liable to lead to a longer design period.

Further, in the method in which a multistage string of delay elements is used for configuration, the strings of delay elements cannot always reproduce the critical path of the target circuit. Further, if preparing a plurality of multistage strings of delay elements differing in characteristics, the size of the circuit increases.

From this point of view, a circuit configuration of a monitor system which has general use, keeps the increase of the circuit scale to a minimum, and enables flexible and efficient design is considered necessary.

DISCLOSURE OF THE INVENTION

A first object of the present invention is to provide a power supply voltage control apparatus carrying an input signal generation circuit having a high general use which is able to be commonly used for monitor circuits having various delays suitable for different types of semiconductor circuits and which can be used for a monitor circuit capable of being changed in delay by electrical control.

Further, a second object of the present invention is to provide a power supply voltage control apparatus carrying a small-sized monitor circuit of a novel configuration.

A third object of the present invention is to provide a power supply voltage control apparatus able to raise the stability of operation of a semiconductor circuit without impeding the effect of reducing the power consumption.

A fourth object of the present invention is to provide a semiconductor device keeping the increase of circuit scale to a minimum and enabling more flexible and efficient design and a method for driving the same.

A power supply voltage control apparatus according to a first aspect of the present invention has a semiconductor circuit having transmission paths and receiving a power supply voltage to operate, an input signal generation circuit able to change a phase difference of both signals in accordance with a control signal when generating a reference signal and an input signal from an input clock signal, a monitor circuit having a characteristic between a power supply voltage and delay equivalent to that of a critical path of the semiconductor circuit, receiving and propagating the input signal from the input signal generation circuit, and outputting a delayed signal to be delayed exactly by a time equivalent to delay of the critical path, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit.

The clock signal is preferably a drive clock signal of the semiconductor circuit.

Preferably, the input signal generation circuit includes a clock generation circuit for receiving as input the clock signal and outputting a first clock signal and a second clock signal having a predetermined phase difference relative to the first clock signal and a frequency division circuit for dividing the first clock signal from the clock generation circuit to generate the input signal and dividing the second clock signal to generate the reference signal. In this case, preferably, the frequency division ratios of the first clock signal and the second clock signal are equal.

Further, preferably, the clock generation circuit includes a PLL circuit having a ring oscillation circuit comprised of a plurality of delay elements connected in a ring shape and a selector for selecting and outputting signals appearing at connection nodes between delay elements of the ring oscillation circuit in accordance with an input control signal.

More preferably, the PLL circuit includes a frequency divider for dividing an output of the ring oscillation circuit by a predetermined frequency division ratio, a phase comparison circuit for comparing phases of a divided signal from the frequency divider and a reference frequency signal and outputting an UP signal or a DOWN signal according to the comparison result, and an oscillation control circuit for supplying a voltage to each delay element of the ring oscillation circuit so as to obtain a predetermined oscillation frequency based on the UP signal or DOWN signal from the phase comparison circuit.

Preferably, the oscillation control circuit includes a charge pump circuit driven by the UP signal or DOWN signal and a loop filter for extracting a direct current voltage component from an output of the charge pump circuit and supplying it to the delay elements.

Further, preferably, the apparatus further comprises a delay element connected to either the input side or the output side of the monitor circuit and adjustable in delay.

Alternatively, the monitor circuit includes a plurality of delay elements connected in series and a selector for receiving as input a plurality of delay signals appearing at connection nodes between the delay elements and selecting and outputting signals having different amounts of delay from the critical path of the semiconductor circuit according to an input selection signal.

According to the power supply voltage control apparatus according to the first aspect of the present invention configured in this way, the phase difference between an input signal and a reference signal output from the input signal generation circuit (delay of the reference signal relative to the input signal) can be changed in accordance with a control signal. For example, when there are a plurality of monitor circuits having different delays, a reference signal appropriate to the delay of each monitor circuit can be generated. Namely, the reference signal is set between the minimum delay and the maximum delay of the monitor circuit, but monitor circuits having different delays can be handled by changing the delay of the reference signal.

In addition, even if configured so that the delay value of the monitor circuit can be changed, this configuration can be dealt with flexibly by changing the delay of the reference signal.

In this way, since the delay of the reference signal from an input signal generation circuit can be changed to an optimal value to enable detection of delay, detection of delay is possible for monitor circuits having various delay values designed in accordance with the type of semiconductor circuit. When a detection result is output from the delay detection circuit, the power supply voltage to be supplied to the semiconductor circuit and monitor circuit from the power supply voltage control circuit is changed or maintained accordingly.

A power supply voltage control apparatus according to a second aspect of the present invention has a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit.

Preferably, the, delay value of the monitor circuit is constant even if the ratio of a gate delay component and RC delay component is equal to that of the critical path and the power supply voltage changes.

Preferably, the input signal generation circuit can change the phase difference of the input signal and the reference signal in accordance with an input control signal. The input signal generation circuit can adopt the same concrete configuration as that of the power supply voltage control apparatus according to the first aspect.

According to the power supply voltage control apparatus according to the second aspect, the built-in monitor circuit is designed so that a delay characteristic similar to the delay characteristic of the critical path of a semiconductor circuit can be obtained. Namely, in the past, a monitor circuit was designed so that the same element configuration as the critical path could be reproduced, but in the power supply voltage control apparatus of the present invention, it is enough if a similar type delay characteristic having an absolute value of the delay and a change of the delay value relative to the power supply voltage smaller than those of the critical path by a constant ratio is obtained. Therefore, it is not necessarily required to provide the same element configuration as with the critical path. For example, it is possible to adopt a circuit configuration in which the absolute value of the delay is made half that of the critical path while maintaining a ratio of the wiring delay component and the gate delay component forming the absolute value of the delay the same. In this case, since the absolute value of the delay is half, it is possible to reduce the number of elements, reduce the element sizes, and shorten the wiring accordingly.

Along with the reduction in the delay of the monitor circuit, the delay value of the reference signal generated in the input signal generation circuit is also made smaller. After inputting the reference signal and the output signal from the monitor circuit to the delay detection circuit, the delay value of the monitor circuit is detected. After the delay detection result is output from the delay detection circuit, the power supply voltage supplied to the semiconductor circuit or the monitor circuit is changed by the power supply control circuit or maintained accordingly.

A power supply voltage control apparatus according to a third aspect of the present invention has a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting a delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit.

The delay detection circuit detects the delay each time the pulse of the reference signal is input. In this case, the power supply voltage control circuit monitors the detection result output from the delay detection circuit and changes the power supply voltage when the same or same direction detection result is maintained for a predetermined number of times successively.

Preferably, the power supply voltage control circuit changes the power supply voltage without confirming a necessity of change of the power supply voltage when the supplied power supply voltage is to be increased and changes the power supply voltage after confirming the necessity when the supplied power supply voltage is to be decreased.

Further, the power supply voltage control apparatus according to the present invention further comprises a pulse generation circuit for generating a pulse of a length equal to one period of the clock of the semiconductor circuit for every number of cycles based on the clock and outputting the same as the input signal to the monitor circuit and for generating a pulse of a constant phase difference with an input signal to the monitor circuit based on the clock of the semiconductor circuit and outputting the same as the reference signal to the delay detection circuit.

The pulse generation circuit, for example, generates a clock pulse signal obtained by frequency division based on the clock of the semiconductor circuit and outputs the same as the input signal to the monitor circuit and generates a pulse of a constant phase difference with an input signal to the monitor circuit based on the clock of the semiconductor circuit and outputs the same as the reference signal to the delay detection circuit.

Further, the power supply voltage control circuit preferably monitors the number of times and extent of changes of the power supply voltage, estimates from the result of the monitoring the power supply voltage after a change based on detection results received from the delay detection circuit when receiving such detection results, and either does not change the power supply voltage or changes the power supply voltage only up to the limit point of the power supply voltage range if the estimate value of the power supply voltage is outside of preset power supply voltage range.

The delay detection circuit may be configured to be able to detect not only the presence of delay, but also phase difference. For example, the delay detection circuit has a delay time monitoring gauge for detecting a phase difference of the output signal of the monitor circuit relative to the reference signal and the detection result output from the delay detection circuit includes data of the phase difference.

The delay time monitoring gauge includes a delay element chain comprised of a plurality of delay elements connected in series. Further, the delay time monitoring gauge indicates the phase difference information by the number of the delay elements or by the delay of the delay elements.

In addition, the delay detection circuit further includes a plurality of detection means for detecting whether or not signals output from taps between elements of the delay element chain are delayed relative to the reference signal.

The power supply voltage control circuit may be configured to decide the amount of change and direction of change of the power supply voltage based on the phase difference information included in the detection result.

In this case, preferably, the power supply voltage control circuit monitors the number of changes of the power supply voltage, amount of change, and direction of change, estimates from the results of the monitoring the power supply voltage after change based on detection results received from the delay detection circuit when receiving such detection results, and either does not change the power supply voltage or changes the power supply voltage only up to the limit point of the power supply voltage range if the estimate value of the power supply voltage is outside of preset power supply voltage range.

A power supply voltage control apparatus according to a fourth aspect of the present invention has a power supply voltage generation circuit for generating a power supply voltage, a semiconductor circuit having transmission paths and receiving power supply voltage from the power supply voltage generation circuit to operate, a monitor circuit receiving power supply voltage from the power supply voltage generation circuit for operation, having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a control circuit for instructing the power supply voltage generation circuit to generate a new power supply voltage based on a result detected by the delay detection circuit, confirming necessity of a change of the power supply voltage, if necessary, instructing a switch from the power supply voltage which had been supplied to the semiconductor circuit and the monitor circuit to the new power supply voltage.

The control circuit, for example, may control the delay detection circuit to have it detect delay a plurality of times and decides a change of the power supply voltage to be necessary and instructs switching to the new power supply voltage if the same or same direction results are maintained in the plurality of detections.

In a power supply voltage control apparatus having the above configuration, the power supply voltage generation circuit forming a power supply voltage control circuit supplies the power supply voltage to the semiconductor circuit and the monitor circuit.

In this state, for example, the pulse generation circuit generates an input signal based on a clock of the semiconductor circuit and inputs the same to the monitor circuit. In the monitor circuit, the input signal is delayed when it is being propagated and the output signal is output as a signal delayed relative to the input signal by the same extent as the critical path of the semiconductor circuit. The output signal of the monitor circuit is input to the delay detection circuit.

On the other hand, the above pulse generation circuit, for example, generates a reference signal having a constant phase difference with the input signal of the monitor circuit and inputs it to the delay detection circuit.

The output signal of the monitor circuit is input to and propagated through the delay element chain provided in the delay detection circuit and becomes a signal delayed by exactly a predetermined time for each delay element. Delay signals having different delay times are extracted in stages from taps between delay elements and are compared in phase with the reference signal in the detection means. If the output of the detection means, for example, is made "1" when the delayed signal is advanced in phase from the reference signal and "0" when it is delayed, the positions of bit inversion of the outputs of the plurality of detection means indicate the phase difference information of the monitor circuit.

The control circuit judges the amount of change and direction of change of the power supply voltage based on the phase difference data and instructs the power supply voltage generation circuit to change the power supply voltage so that the phase difference becomes appropriate. Due to this, the power supply voltage supplied to the semiconductor circuit and the monitor circuit is optimized to a minimum value required for normal operation.

In the present invention, in such a power supply voltage control apparatus, even if the control circuit receives the detection results from the delay detection circuit, it does not immediately instruct a change of the power supply voltage. For example, it instructs a change of the power supply voltage based on the results only when the delay is detected a predetermined number of times and all indicate the same or the same direction results. Therefore, when the power supply voltage fluctuates in a very short time and thus the signal propagation speed in the monitor circuit rises temporarily, the detection results from the delay detection circuit cannot be maintained the same or in the same direction for a predetermined number of times, so no instruction for changing the power supply voltage is issued. Conversely, for example, if the ambient temperature of the surroundings changes and the minimum operating voltage of the semiconductor circuit fluctuates etc., the same or the same direction delay detection results are maintained for a predetermined number of times, so the power supply voltage is changed.

Note that, separate from this, if it is expected that the power supply voltage will deviate from a predetermined range of the power supply voltage due to the next change, either the power supply voltage will not be changed or the change of the power supply voltage will be restricted to the limit point of that range.

A fifth aspect of the present invention provides a semiconductor device having a monitor circuit for monitoring delay on a critical path of a target circuit to obtain a delay characteristic of the critical path, wherein the monitor circuit has an oscillatable delay reference element and a counter, initiates an oscillation of the delay reference element in synchronization with an input timing of a reference signal, counts with the counter an oscillation signal accompanying start of the oscillation, when the count reaches a preset setting value, outputs a delayed signal to be delayed by exactly an amount specified by a setting value in the delay reference element, and stops the oscillation of the delay reference element.

Further, a sixth aspect of the present invention provides a semiconductor device having a monitor circuit for monitoring delay on a critical path of a target circuit to obtain a delay characteristic of the critical path, wherein the monitor circuit has a plurality of monitor units, each of which has an oscillatable delay reference element and a counter, initiates an oscillation of the delay reference element in synchronization with an input timing of a reference signal, counts with the counter an oscillation signal accompanying start of the oscillation, when the count reaches a preset setting value, outputs a delayed signal to be delayed by exactly an amount specified by a setting value in the delay reference element, and stops the oscillation of the delay reference element and wherein the device further comprises a connection selecting means for receiving a selection signal and connecting the plurality of monitor units in parallel or in series relative to an input of the reference signal and a selecting means for selecting a signal with a larger delay among outputs of the plurality of monitor units as a delayed signal.

Further, in the present invention, the monitor circuit or each monitor unit comprises a delay deciding circuit that receives an output of the counter, decides a desired delay by adding the delay value of the oscillatable delay reference element until the value specified by the setting value, and outputs the delayed signal.

Further, in the present invention, the oscillatable delay reference element includes delay sub-elements having different delay characteristics.

Further, in the present invention, the semiconductor device comprises a register enabling setting of the above setting or selection signal for the connection selecting means.

Further, in the present invention, the semiconductor device comprises an external input terminal for receiving as an input the setting or the selection signal for the connection selecting means from the outside.

Further, in the present invention, the oscillatable delay reference element includes a ring oscillator.

Further, a semiconductor device according to a seventh aspect of the present invention has a target circuit having transmission paths and receiving a power supply voltage to operate, a monitor circuit receiving a power supply voltage to operate and for monitoring delay of a critical path of the target circuit to obtain a delay characteristic of the critical path, which includes an oscillatable delay reference element and a counter, initiates an oscillation of the delay reference element in synchronization with an input timing of a reference signal, counts with the counter an oscillation signal accompanying start of the oscillation, and when the count reaches a preset setting value, outputs a delayed signal to be delayed by exactly an amount specified by a setting value in the delay reference element and stops the oscillation of the delay reference element, a delay detection circuit for receiving the output delayed signal from the monitor circuit and a reference signal and detecting delay of the output delayed signal relative to the reference signal, and a voltage generation circuit for supplying a power supply voltage a value of which is adjusted based on a result detected by the delay detection circuit, to the target circuit and the monitor circuit.

Further, a semiconductor device according to an eighth aspect of the present invention has a target circuit having transmission paths and receiving a power supply voltage to operate, a monitor circuit including a plurality of monitor units each receiving a power supply voltage to operate and monitoring delay of a critical path of the target circuit to obtain a delay characteristic of the critical path, each of which includes an oscillatable delay reference element and a counter, initiates an oscillation of the delay reference element in synchronization with an input timing of a reference signal, counts with the counter an oscillation signal accompanying start of the oscillation, and when the count reaches a preset setting value, outputs a delayed signal to be delayed by exactly an amount specified by the preset setting value of the delay reference element and stops the oscillation of the delay reference element, a connection selecting means for receiving a selection signal and connecting the plurality of monitor units in parallel or in series relative to an input of the reference signal, and a selecting means for selecting from outputs of the plurality of monitor units a signal having a larger delay as a delayed signal, a delay detection circuit for receiving the output delayed signal from the monitor circuit and a reference signal and detecting delay of the output delayed signal relative to the reference signal, and a voltage generation circuit for supplying a power supply voltage having a value adjusted based on the detection result of the delay detection circuit to the target circuit and the monitor circuit.

Further, a ninth aspect of the present invention provides a method for driving a semiconductor device comprising a monitor circuit for monitoring a delay of a critical path of a target circuit to obtain a delay characteristic of the critical path, comprising the steps of setting a desired setting value, initiating an oscillation of an oscillatable delay reference element in synchronization with an input timing of a reference signal, counting an oscillation signal accompanying start of the oscillation, and, when the count reaches the setting value, outputting a delayed signal to be delayed by exactly an amount specified by a setting value in the delay reference element and stopping the oscillation of the delay reference element.

According to the present invention, a monitor circuit for obtaining a grasp of a critical path of a target circuit is provided using an oscillatable delay reference element as a main constituent element and for example a counter is used to add the delay of the delay reference element to obtain a desired delay.

Specifically, for example, a reference signal is input to the monitor circuit in a state where a desired setting is given from the outside.

In the monitor circuit, an oscillation action of the oscillatable delay reference element is initiated in synchronization with an input timing of the reference signal. By this, an oscillation signal of a certain period is output. This oscillation signal is counted by a counter.

When the count reaches a setting value, a signal delayed by exactly an amount specified by a setting value of the delay reference element is output. In addition, at this time, the oscillation action of the delay reference element is stopped.

Due to this, different delay component characteristics are combined, it is possible to more closely approach the configuration of the critical path of the target circuit, and it becomes possible to keep to a minimum the increase in the size of the circuit due to the provision of a plurality of delay elements having different delay characteristics.

BRIEF DESCRIPTION OF THE DRAWINGS

FIGS. 8A to 8F are timing charts showing waveforms of operation of a delay detection circuit in the power supply voltage control apparatus according to the third embodiment.

FIGS. 11A to 11C are views showing the waveform of the supplied voltage and various variables and changes in state when the minimum required voltage for normal operation of a semiconductor circuit decreases due to for example a change in the ambient temperature.

FIGS. 12A to 12C are views showing the waveform of the supplied voltage and various variables and changes in state when the power supply voltage rises due to superposition of positive noise on the power supply voltage.

FIGS. 13A to 13C are views showing the waveform of supplied voltage and various variables and changes in state when the minimum required voltage rises due to a change in the ambient temperature during standby loop treatment or consumption of a battery acting as a power supply.

FIGS. 14A to 14C are views showing the waveform of supplied voltage and various variables and changes in state when confirmation of the necessity for a change in the power supply voltage is skipped as a comparative example in the third embodiment.

FIGS. 18A to 18E are timing charts for explaining operations of the delay reference element in FIG. 16.

FIGS. 27A to 27D are timing charts showing signal waveforms for explaining operation of the power supply voltage control apparatus in FIG. 26.

BEST MODE FOR CARRYING OUT THE INVENTION

Preferable embodiments of the present invention will be described next with reference to the accompanying drawings.

First Embodiment

Figure 1:
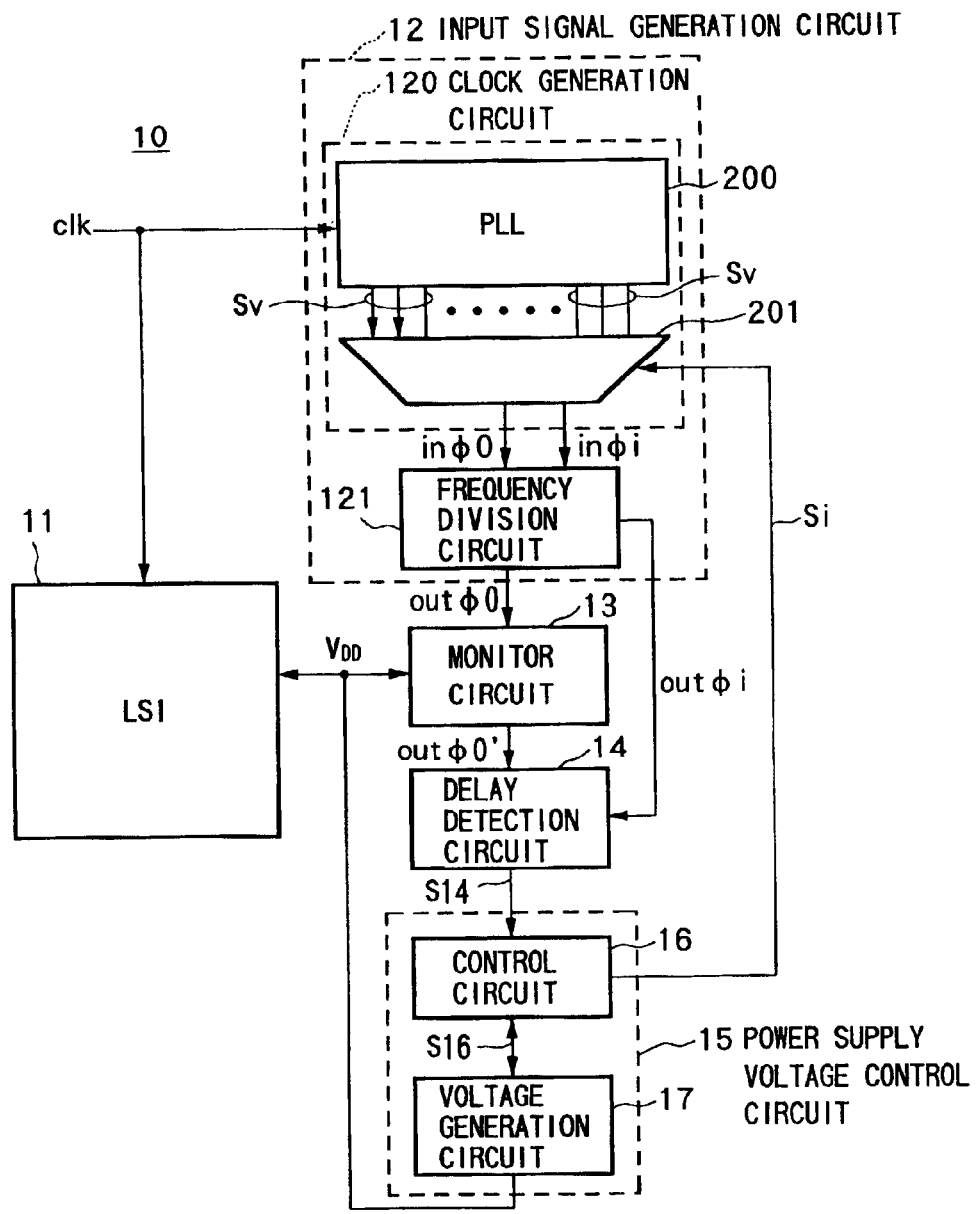
FIG. 1 is a block diagram of the configuration of a power supply voltage control apparatus according to a first embodiment.

FIG. 1 is a block diagram of an embodiment of a power supply voltage control apparatus according to the present invention.

The power supply voltage control apparatus 10 includes a semiconductor circuit 11 (LSI) serving as a target circuit supplied with a controlled power supply voltage $V_{DD}$, an input signal generation circuit 12, a monitor circuit 13 for monitoring the delay characteristic of the critical path of the LSI 11, a delay detection circuit 14, and a power supply voltage control circuit 15. The power supply voltage control circuit 15 has a control circuit 16 and a voltage generation circuit 17.

Together with the semiconductor circuit 11, the input signal generation circuit 12, the monitor circuit 13, and the delay detection circuit 14 are integrated on a single chip. The power supply voltage control circuit 15 may be integrated in the same chip as the LSI or in another LSI.

The semiconductor circuit 11 is supplied with the power supply voltage $V_{DD}$ by the voltage generation circuit 17 and further has a plurality of not shown transmission paths.

Each transmission path, for example, is provided with gate elements. Each gate element is formed for example using an insulated gate type field effect transistor, namely an MIS (metal-insulator-semiconductor) transistor.

The input signal generation circuit 12 has a clock generation circuit 120 and a frequency division circuit 121. The clock generation circuit 120 is formed by a PLL circuit 200 and a selector 201.

The PLL circuit 200 has a voltage controlled oscillator (VCO). The oscillation frequency is locked based on, for example, the LSI driving clock clk input from the outside. The plurality of outputs Sv of the PLL circuit 200 are connected to the inputs of the selector 201. A first output and second output of the selector 201 are connected to the inputs of the frequency division circuit 121. The selector 201 outputs from its second output a signal in$\phi$i i delayed in phase by exactly i from a signal in$\phi$0 sent to its first output. This phase i can be expressed as any phase angle between 0 and $2\pi$.

Figure 2:
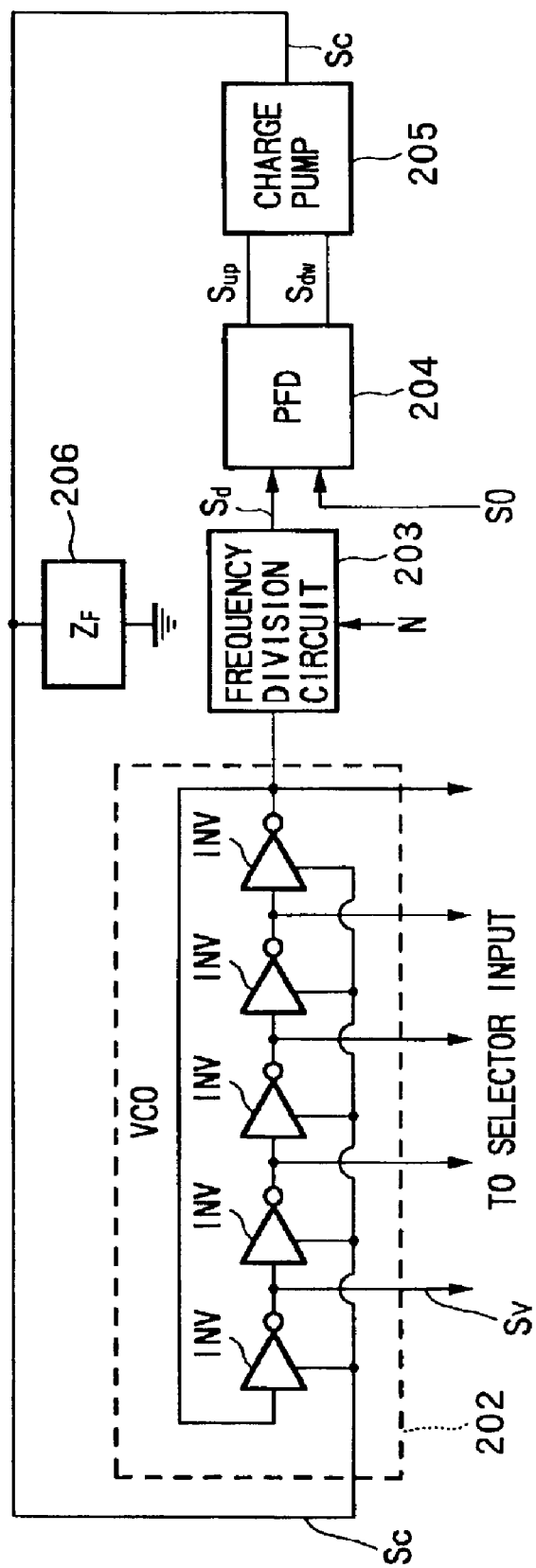
FIG. 2 is a block diagram of the configuration of a PLL circuit in the power supply voltage control apparatus according to the first embodiment.

FIG. 2 is a block diagram of an example of the configuration of the PLL circuit.

The VCO 202 is formed by connecting an odd number of inverters (INV) (5 in the example in FIG. 2) in a ring in series. Outputs of the VCO 202 are extracted from connection nodes of the inverters INV and are connected to selectors. Further, one of the outputs of the VCO 202 is connected to one input of a phase frequency detector (PFD) via the frequency division circuit 203.

A signal S0 serving as a reference of the frequency divided signal, for example the LSI driving clock signal clk, is input to the other input of the PFD 204. The charge pump circuit 205 is connected to the output of the PFD 204 so as to output an UP signal Sup or a DOWN signal Sdw.

The output of the charge pump circuit 205 is connected so that it is returned to each inverter INV as a control voltage Sc of the VCO 202. In the middle of the connection line, a loop-filter 206 for removing the AC component of the charge pump output signal is provided.

The frequency division circuit 121 in FIG. 1 divides the signal in$\phi$0 from the first input by a specified frequency division ratio to generate an input signal out$\phi$0 of the monitor circuit 13. In addition, for example, it divides the signal in$\phi$i from the second input by the same frequency division ratio to generate a reference signal out$\phi$i to be input to the delay detection circuit 14. This reference signal out$\phi$i is generated as a signal delayed by exactly a variable delay value D relative to the input signal out$\phi$0 of the monitor circuit 13.

If the period of the two signals out$\phi$0 and out$\phi$1 is denoted by F, the delay value D can be represented by $(n+i/2\pi)F$, where n is 0 or a positive integer.

Note that the duty ratios of the input signal out$\phi$0 of the monitor circuit 13 and the reference signal out$\phi$i may be any ratios. The signals may be ones with ratios of 50% or less like one-shot pulses.

The thus generated input signal out$\phi$0 and the reference signal out$\phi$i have frequencies lower than the LSI driving clock clk. This reason is explained below.

The delay time of the monitor circuit 13 changes largely depending on the power supply voltage $V_{DD}$.

If the power supply voltage $V_{DD}$ is low and the delay time of the monitor circuit 13 is extremely large, the delay detection circuit 14 detects the phase difference by the edge of a clock delayed by 2 cycles or more. The power supply voltage $V_{DD}$ is therefore liable to be controlled so that the phases coincide in this delay time.

To prevent this, the pulse generating cycle of the input signal generation circuit 12 is set so that the phase difference is detected in a time sufficiently longer than the delay time of the monitor circuit 13 when the power supply voltage $V_{DD}$ is low.

The monitor circuit 13 is formed as a circuit having the same characteristic between a power supply voltage and delay as that of a signal transmission path selected as a critical path of the semiconductor circuit 11. It receives the supply of a power supply voltage $V_{DD}$ from the voltage generation circuit 17 to operate, receives and propagates the signal out$\phi$0 from the frequency division circuit 121, and outputs a delayed signal out$\phi$0' to the delay detection circuit 14.

Figure 3:
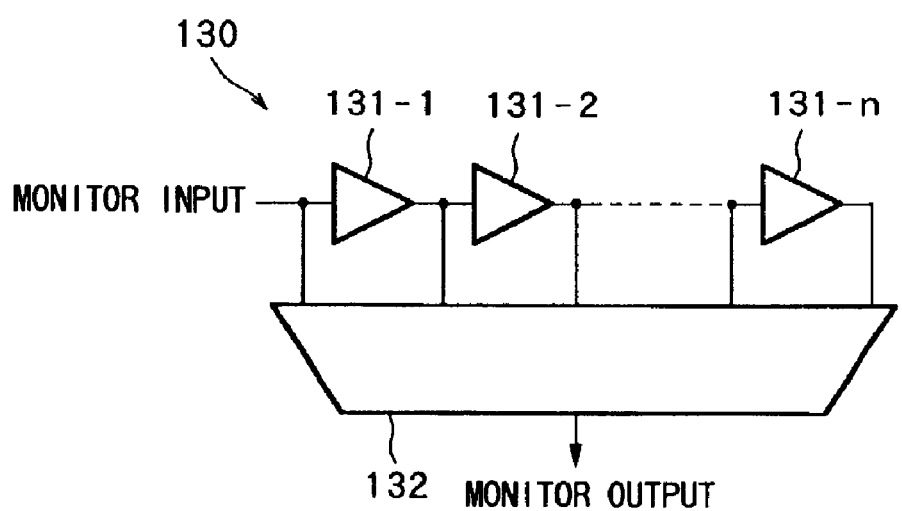
FIG. 3 is a block diagram of an example of constituent elements of a monitor circuit in the power supply voltage control apparatus according to the first embodiment.
Figure 4:
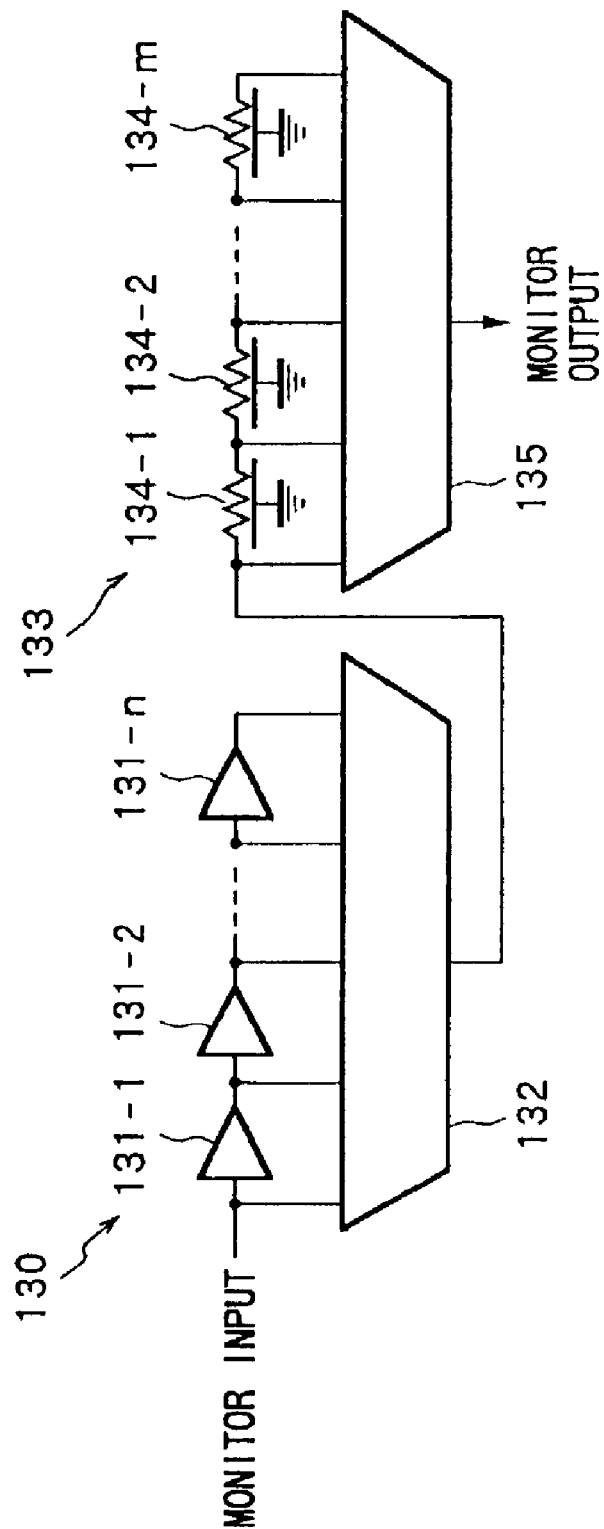
FIG. 4 is a block diagram of another example of constituent elements of a monitor circuit.

FIG. 3 and FIG. 4 show two examples of constituent elements of the monitor circuit. A monitor circuit 13 configured by these elements can be freely changed in combination of the delay elements according to the setting and can give a desired delay characteristic by this combination.

Specifically, the constituent elements of the monitor circuit shown in FIG. 3 are the plurality of gate delay elements 131-1, 131-2, ..., 131-n as delay elements connected in series and the delay element 130 including the selector 132.

Further, in the constituent elements of the monitor circuit shown in FIG. 4, a delay element expressing the RC delay component is connected in series to the delay element 130 in FIG. 3. The delay element 133 includes a plurality of RC delay elements 134-1, 134-2, . . . , 134-m as delay sub-elements connected in series and the selector 135. The RC delay elements 134-1, 134-2, . . . , 134-m, for example, are formed by aluminum wirings etc.

Note that each of the gate delay elements 131-1, 131-2, . . . , 131-n is designed to give a specific desired delay characteristic, for example, by connecting an even number of inverters in series. Further, the monitor circuit 13 may naturally also be configured to have a fixed delay.

The delay detection circuit 14 in FIG. 1 detects the phase difference between the reference signal out$\phi$i and the output signal out$\phi$0' of the monitor circuit 13. An x-bit (X: any natural number) delay detection signal S14 is generated in accordance with the detection result and is output to the control circuit 16.

For example, the delay detection circuit 14 is comprised of a delay element chain comprised of (x−1) number of buffers connected in series and forming a gauge for monitoring the delay time monitor and x number of D-type flip-flops. These D-type flip-flops fetch delayed signals appearing at the connection nodes between delay elements, for example, at the timing of the rising edge of the pulse of the reference signal out$\phi$i and send them as the x-bit delay detection signal S14 to the control circuit 16.

Note that, the larger the number x of bits of the output of the delay detection circuit 14, the finer the phase difference that can be detected and the broader the detectable phase range (D range). The configuration of the delay element chain is not limited to a gate chain. Further, the gates forming a gate chain may be buffers or anything else.

The control circuit 16 controls the voltage generation circuit 17 to change the voltage $V_{DD}$ to be supplied to the LSI 11 and the monitor circuit 13 based on the delay detection signal S14.

Namely, the control circuit 16 sends out a request signal S16 to the voltage generation circuit 17 to increase the supplied voltage $V_{DD}$ when the output outdo of the monitor circuit 13 is delayed by a specified delay value defined by the reference signal out$\phi$i. Conversely, the control circuit 16 sends out a request signal S16 to the voltage generation circuit 17 to decrease the supplied voltage $V_{DD}$ when the output out$\phi$0 of the monitor circuit 13 is earlier than a specified delay value or is earlier than a delay value obtained by subtracting a certain margin from the specified delay value.

Due to this, the voltage generation circuit 17 generates a new power supply voltage $V_{DD}'$ and changes the supplied voltage up to then to the new power supply voltage $V_{DD}'$. Note that, when setting a margin in the delay value, the supplied voltage is not changed if the output out$\phi$0 of the monitor circuit 13 is within the margin.

The power supply voltage control circuit 15 formed by the control circuit 16 and the voltage generation circuit 17, for example, can be configured by using a control means such as a microcomputer or processor, D/A converters, and DC—DC converters. The control means that serves as a main constituent element of the control circuit 16 receives the delay detection signal S14 and outputs to the D/A converter a digital signal for issuing a command of change of the supplied voltage. The D/A converter converts the control signal to an analog signal and outputs it to the DC—DC converter.

The DC—DC converter that serves as a main constituent element of the voltage generation circuit 17 converts the analog reference voltage to a new power supply voltage $V_{DD}'$ and switches it with the power supply voltage $V_{DD}$ output until then at the specified timing mentioned above.

When the control circuit 16 is designed using a processor etc. in this way, the power supply voltage can be controlled by a program and can be easily changed. Especially, the delay margin and appropriate delay range do not have to be set by the amounts of delay of the delay elements in the delay detection circuit and can be set by the program.

When the number (x) of delay elements in the delay detection circuit 14 is large and the phase difference is finely detected, the delay steps of the delay elements can be made constant and the delay element chain can be simply used as a delay scale.

For example, in this case, the delay margin and appropriate delay range may be set by the serial number of the delay elements and/or number of gates in the program in the control circuit 16. Further, by combination with a DC—DC converter, the span of voltage change can be set in more diverse ways in accordance with the detected quantity in the delay scale.

Next, an explanation will be made particularly of the operation of generation and change of the monitor input signal and the reference signal in a thus configured power supply control apparatus 10 by using timing charts showing the relation with the monitor output.

FIGS. 5A to 5F are timing charts showing waveforms of input and output signals of the input signal control circuit and the monitor circuit.

In the present embodiment, the delay value of the reference signal relative to the monitor input signal can be set freely within the range of the ability of the PLL circuit 200 or the frequency division circuit 121 inside the input signal generation circuit 12. FIGS. 5A to 5F illustrate the case where the delay value is set shorter than the clock pulse length.

First, generation of the clock shown in FIGS. 5A and 5C will be explained.

In FIG. 2, the VCO 202 oscillates at a certain frequency. Its output is divided by N to 1/N frequency by the frequency division circuit 203, then is input to one input of the phase frequency detector (PFD) 204. At this time, a reference frequency signal S0 is input to the other input terminal of the PFD 204.

The PDF 204 outputs either a pulse signal of an UP signal Sup or a DOWN signal Sdw in accordance with the phase difference between the frequency divided signal Sd and the reference frequency signal S0. For example, a DOWN signal Sdw is output when the frequency divided signal Sd is advanced in phase from the reference frequency signal S0, while conversely an UP signal Sup is output when the frequency divided signal Sd is delayed in phase from the reference frequency signal S0.

The charge pump 205 generates a charge or discharge current according to the DOWN signal Sdw or the UP signal Sup from the PFD 204. When a charge current is generated, the voltage level of the output signal Sc rises, while when a discharge current is generated, the voltage level of the output signal Sc falls.

The loop-filter 206 removes the AC voltage component of the signal SC and leaves the DC voltage component. The signal Sc comprised of the DC voltage component is supplied to the VCO 202 as a control signal.

The VCO 202 is controlled in the oscillation frequency according to the voltage level of the control signal Sc and outputs a plurality of oscillation signals Sv shifted in phase by exactly the delay value of the inverter INV to the selector 201.

For example, when the voltage level of the control signal Sc rises, the oscillation frequency of the VCO 202 becomes higher, while when the voltage level of the control signal Sc falls, the oscillation frequency of the VCO 202 becomes lower.

After one operation cycle, the oscillation signal Sv is divided again, then is input to the PFD 204. In the same way as described above, the frequency divided signal Sd is compared with the reference frequency signal S0 in phase at the PFD 204. The oscillation frequency of the VCO 202 is controlled by the change pump in accordance with the result.

Therefore, the oscillation frequency of the VCO 202 becomes stable when matching with a specific frequency defined by the reference frequency signal S0 and then is locked to that state.

When the oscillation frequency of the PLL circuit 200 is locked, neither the DOWN signal Sdw nor the UP signal Sup is output any longer from the PFD 204. The voltage level of the control signal Sc is kept constant. At this time, the oscillation frequency of the VCO 202 is the frequency of the reference frequency signal S0 multiplied by the frequency division ratio of the frequency division circuit 203.

The selector 201 in FIG. 1 receives as input the plurality of oscillation signals Sv from the PLL circuit 200, selects two oscillation signals in$\phi$0 and in$\phi$i of a phase difference i from among these based on the control signal Si received from the control circuit 16, and outputs them to the frequency division circuit 121.

FIG. 5A and FIG. 5C show these two signals in$\phi$0 and in$\phi$i. The figures show that the signal in$\phi$i is delayed from the signal in$\phi$0 by exactly I=(i/2$\pi$)F. Here, F is the period of the reference frequency signal S0 of the PLL circuit, for example, the LSI driving clock clk.

Figure 5:
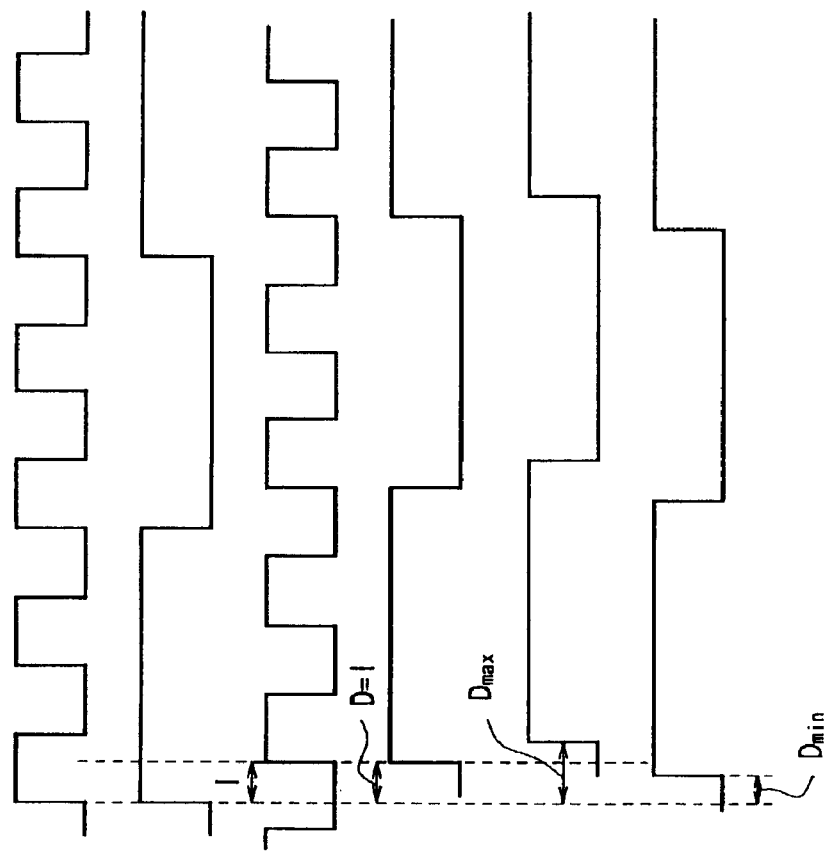
FIGS. 5A to 5F are timing charts showing waveforms of input and output signals of an input signal control circuit and the monitor circuit in operation of the power supply voltage control apparatus according to the first embodiment.

The frequency division circuit 121 receiving the two signals in$\phi$0 and in$\phi$i divides them by the same frequency division ratio and otherwise processes them to output an input signal out$\phi$0 of the monitor circuit 13 and a reference signal out$\phi$i delayed in phase by exactly (n+i/2$\pi$)F relative to this. Here n is 0 or any positive integer. FIGS. 5 (A to F) show the case where n=0. Therefore, as shown in FIG. 5B and FIG. 5D, the delay value D between the input signal out$\phi$0 and the reference signal out$\phi$i becomes the same as the delay value I between the input clocks in$\phi$0 and in$\phi$i.

The delay value D between the input signal out$\phi$0 and the reference signal out$\phi$i is set between the maximum delay value Dmax intrinsic to the monitor circuit shown in FIG. 5E, and the minimum delay value Dmin shown in FIG. 5F. Here, the maximum delay value Dmax is the delay value when the minimum voltage required for operation is applied to the monitor circuit 13 having the same characteristic between a power supply voltage and delay as the critical path of the LSI 11, while the minimum delay value Dmin is the delay value when the maximum voltage output by the voltage generation circuit 17 is applied to the monitor circuit 13. Note that the minimum voltage required for operation of the monitor circuit 13 changes with the ambient temperature etc., so the maximum delay value Dmax changes accordingly.

In the present embodiment, the delay value D between the monitor input signal out$\phi$0 and the reference signal out$\phi$i can be freely set according to the control signal Si from the control circuit 16. Therefore, if the delay value D is out of the range between the maximum delay value Dmax and the minimum delay value Dmin intrinsic to the monitor circuit 13, correction can be made easily.

For example, if assuming that the maximum delay value Dmax of the monitor circuit is less than that shown in FIG. 5E and less than the delay value D of the reference signal out$\phi$i, the selector 201 can select a lower oscillation signal and output it as a signal in$\phi$(i−1), in$\phi$(i−2), . . . to make the delay value D smaller than the maximum delay value Dmax.

Due to the above, it becomes possible to suitably detect delay by changing the phase of the reference signal.

Further, because the input signal generation circuit 12 according to the present embodiment can be freely changed in the delay value D of the output signal, it can be used generally for a plurality of monitor circuits having various different delay values corresponding to the type of the LSI 11.

Namely, in a large scale LSI, the delay of the critical path increases and therefore the delay of the monitor circuit also increases. In the present embodiment, however, it is easy to increase the delay value D between the signals out$\phi$0 and out$\phi$i to match with the delay detection capability. Further, the reverse is also easy.

Consequently, the design and development load for a power supply voltage control apparatus using a monitor circuit is reduced.

Second Embodiment

The second embodiment relates to the change of the delay characteristic of a monitor circuit. Therefore, the configurations and basic operations of the parts of the power supply voltage control apparatus are the same as those of the first embodiment. FIG. 1 to FIG. 4 and FIGS. 5A to 5F are applied as they are.

In the above first embodiment, the characteristic between a power supply voltage and delay of the monitor circuit 13 was set to be equivalent to that of the critical path of the semiconductor circuit (LSI) 11.

As opposed to this, in the second embodiment, the monitor circuit 13 is given a characteristic between a power supply voltage and delay similar to that of the critical path. Here, "a characteristic between a power supply voltage and delay similar to that of the critical path" means a delay characteristic outputting a delayed signal having an absolute value of the delay and a change of the delay relative to the power supply voltage smaller than or larger than those of the critical path by a constant ratio.

In the sense of enabling a reduction of the size of the monitor circuit, preferably the ratio of the absolute value and the change of the delay value is smaller. Below, the case where the ratio of change of the delay value is small will be explained.

FIGS. 6A to 6D are graphs of waveforms of monitor input and output and delay components in operation of the power supply voltage control apparatus according to the second embodiment.

Figure 6:
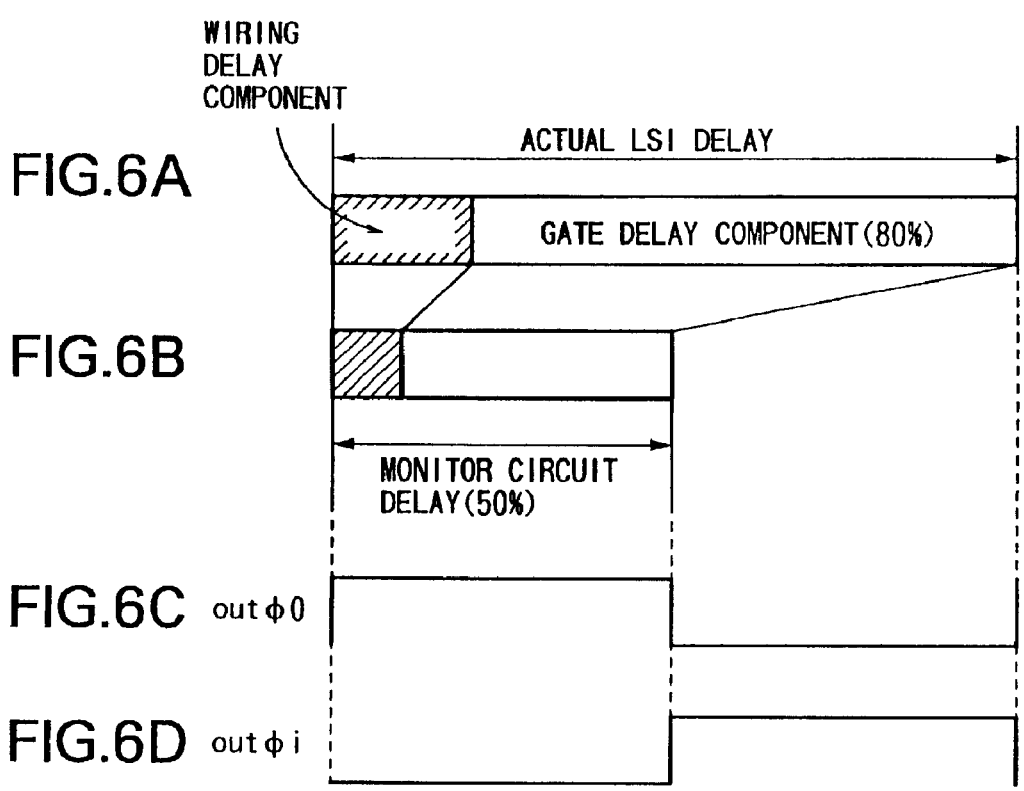
FIGS. 6A to 6D are graphs of waveforms of monitor input and output and delay components in operation of the power supply voltage control apparatus according to a second embodiment.

The "actual delay value of LSI" in FIG. 6A is the delay of the critical path itself of the LSI. In the case of this figure, the wiring delay component accounts for 20% of this, and the gate delay component for 80%.

The "delay value of monitor circuit" in FIG. 6B is the delay value of the monitor circuit mounted in the LSI. This monitor circuit, as described above, has a characteristic between a power supply voltage and delay similar to that of the critical path.

Therefore, in the same way as in FIG. 6A, the wiring delay component accounts for 20% of this, and the gate delay component for 80%, but the absolute value of the delay is set small to for example 50% of the "actual delay value of LSI".

Here, as illustrated in FIG. 6C, the monitor input signal outϕ0 is for example a signal of a duty ratio of 50% obtained by dividing the LSI driving clock clk by 2.

In this case, based on the control signal Si, an initial value is set so that the reference signal outϕi for delay detection is delayed by 180 degrees in phase from the monitor input signal outϕ0.

Alternatively, the reference signal outϕi is generated by inverting the monitor input signal outϕ0 in phase.

In either case, as shown in FIG. 6D, a reference signal outϕi delayed by 180 degrees in phase from the monitor input signal outϕ0 is obtained.

This monitor circuit operates with a delay value of 50% of that of the actual critical path of the LSI. By using the illustrated signals outϕ0 and outϕi for the monitor circuit, detection of delay detection becomes possible.

The delay detection result of the monitor circuit can be used as the delay monitor result of the critical path of the LSI since even if the absolute value of the circuit delay is 50%, the ratio of the delay components is the same as that of the critical path of the LSI.

By setting the absolute value of the delay of the monitor circuit smaller than that of the critical path of the LSI in this way, there is the advantage that it is possible to reduce the circuit scale (number of elements and area) of the monitor circuit.

Note that, while the effect of reducing the circuit scale is not obtained, it is also possible to make the delay of the monitor circuit in FIGS. 6A to 6D half of the LSI side by for example making the frequency of the reference frequency signal S0 in FIG. 2 twice that of the LSI operating clock clk.

Third Embodiment

Figure 7:
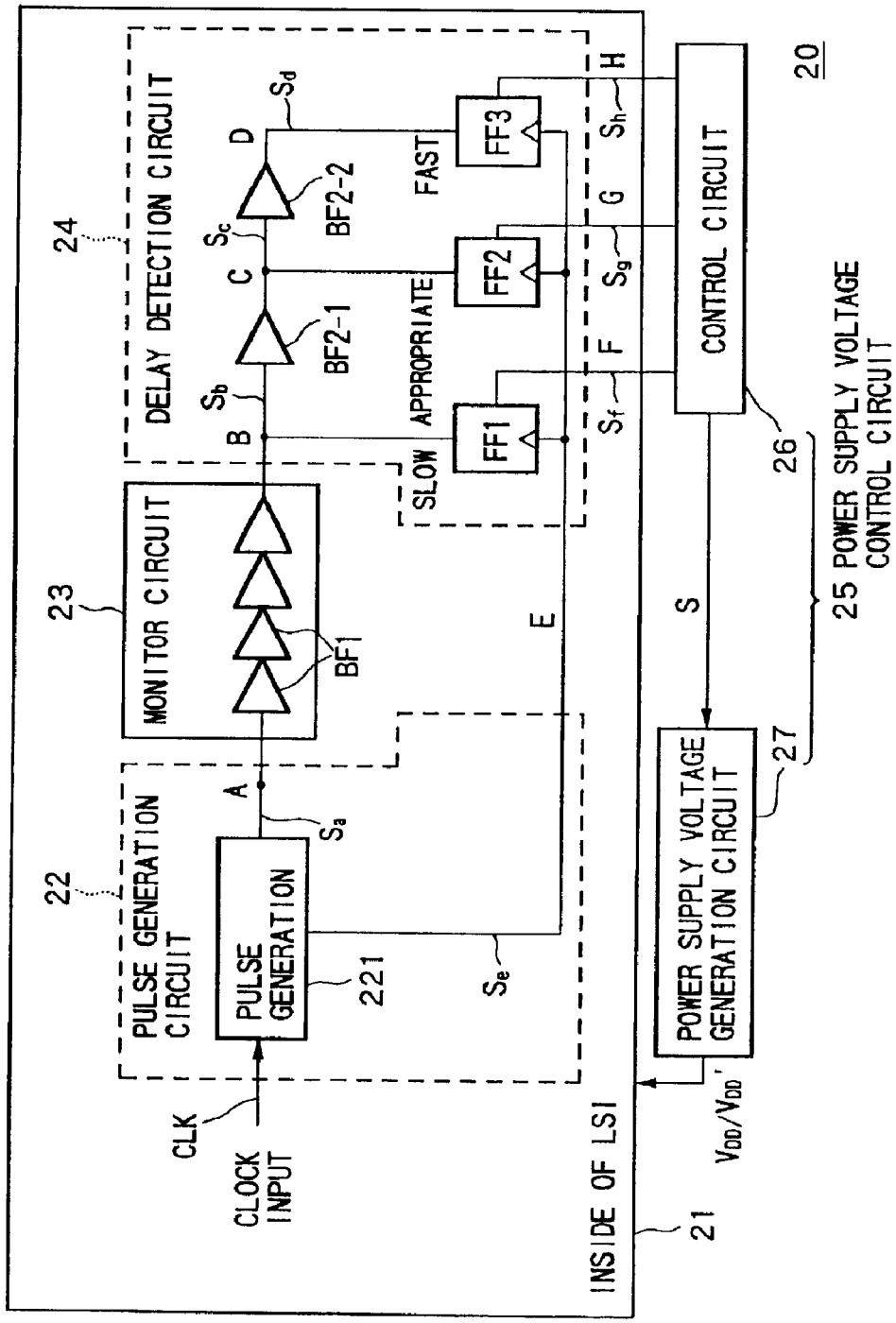
FIG. 7 is a block diagram of the configuration of a power supply voltage control apparatus according to a third embodiment.

FIG. 7 is a block diagram of another embodiment of the power supply voltage control apparatus according to the present invention.

The power supply voltage control apparatus 20 includes a semiconductor circuit 21 (LSI) supplied with a controlled power supply voltage $V_{DD}$, a pulse generation circuit 22, a monitor circuit 23 for monitoring the delay characteristic of the critical path of the LSI 21, a delay element chain type delay detection circuit 24, and a power supply voltage control circuit 25. The power supply voltage control circuit 25 has a control circuit 26 and a power supply voltage generation circuit 27.

The semiconductor circuit 21 has the pulse generation circuit 22, the monitor circuit 23, and the delay detection circuit 24 integrated in it.

The semiconductor circuit 21 is supplied with the power supply voltage $V_{DD}$ by the power supply voltage generation circuit 27 and has a plurality of not shown transmission paths.

Each transmission path, for example, is provided with gate elements. Each gate element is formed by for example an insulated gate type field effect transistor, namely an MIS (metal-insulator-semiconductor) transistor.

The pulse generation circuit 22 has a pulse generator 221. The pulse generator 221 for example receives the system clock CLK of the semiconductor circuit 21, generates a pulse signal Sa for every certain number of cycles based on this, and, further, generates a reference signal Se having a constant phase difference with the pulse signal Sa.

In the following, the reason why one pulse signal Sa is generated for every certain number of clock cycles will be explained.

The monitor circuit 23 changes largely in delay time depending on the power supply voltage $V_{DD}$.

If the power supply voltage $V_{DD}$ is low and the delay time of the monitor circuit 23 is extremely large, the delay detection circuit 24 detects the phase difference by the edge of a clock delayed by 2 cycles or more. The power supply voltage $V_{DD}$ is therefore liable to be controlled so that the phases coincide in this delay time.

To prevent this, the pulse generating cycle of the input signal generation circuit 22 is set so that the phase difference is detected in a time sufficiently longer than the delay time of the monitor circuit 23 when the power supply voltage $V_{DD}$ is low.

The monitor circuit 23 is formed as a circuit having the same characteristic between a power supply voltage and delay as that of a signal transmission path selected as a critical path of the semiconductor circuit 11. It receives the supply of a power supply voltage $V_{DD}$ from the voltage generation circuit 27 to operate, receives and performs gate processing on and otherwise propagates the output signal Sa of the pulse generator 221, and outputs a delayed signal Sb to the delay detection circuit 24.

The monitor circuit 23 for example is formed by connecting in series any number (4 in the example in FIG. 7) of buffers BF1 each comprised of an even number of inverters (INV) connected in series.

The monitor circuit 23 is designed to give a desired signal delay characteristic by the number of the inverters and buffers BF1.

The delay detection circuit 24 detects the phase difference between the reference signal Se and the output signal Sb of the monitor circuit 23, generates an n-bit (n: any natural number) delay detection signal in accordance with the detection result, and outputs it to the control circuit 26.

Specifically, the delay detection circuit 24 is for example comprised of a delay element chain comprised of (n−1) number of buffers BF2 connected in series and serving as a gauge for monitoring the delay time and n number of D-type flip-flops FF.

Note that, the larger the number n of output bits of the delay detection circuit 24, the finer the phase difference that can be detected and the broader the phase range (D range) that can be detected. Here, n is assumed to be 3 for simplicity of explanation. Therefore, two buffers BF2 and three D-type flip-flops FF (1 to 3) are provided.

Each of the buffers BF2-1 and BF2-2 has a configuration corresponding to the amount of delay serving as the unit of phase difference detection and for example is comprised of two inverters.

Note that the configuration of the delay element chain is not limited to a gate chain. Further, the gates forming the gate chain are not limited to buffers comprised of two inverters.

The output nodes C and D of the buffers BF2-1 and BF2-2 forming the delay element chain are connected to the input D-terminals of the flip-flop FF2 and FF3, respectively, while the input node B of the first buffer BF2-1 is connected to the input terminal D of the flip-flop FF1.

The CK terminals of the flip-flops FF1 to FF3 are connected to the output node E of the pulse generation circuit 22 to enable the reference signal Se to be supplied in parallel. Since this reference signal Se is delayed from the input signal Sa of the monitor circuit 23 by a certain time (for example, one period of the system clock CLK), it can be detected by the flip-flops FF1 to FF3 up to which gate the signal Sa reaches after one period of the system clock.

FIGS. 8A to 8F are timing charts showing waveforms of operation of the delay detection circuit 24.

FIG. 8A and FIG. 8F illustrate the relation of the system clock CLK, the input signal Sa of the monitor circuit 23, and the reference signal Se appearing at the node E.

In addition, FIGS. 8B to 8E show the relation of signals at the nodes B to D in the delay detection circuit 24 and the delay detection signal.

FIG. 8B shows the case where the supplied voltage is considerably low, FIG. 8C the case where the supplied voltage is somewhat low, FIG. 5D the case where the supplied voltage in an appropriate range, and FIG. E the case where the supplied voltage is high. Note that FIG. 8F is an example of modification of the generation of a reference pulse. Here, the input signal Sa is inverted to generate the reference signal Se.

The D-type flip-flops detect the state of the input D-terminal at the rising edge of the clock pulse at the CK terminal and thereby determine the state of the output terminal.

Therefore, at the rising edge of the clock pulse (reference signal Se) at the CK terminal, if the bits of the output signal of the delay detection circuit 24 are represented by F, G, H, this bit string (F,G,H)=(0,0,0) in the case of FIG. 8B where all signals of the nodes B to D are "0" (low), (F,G,H)=(1,0,0) in the case of FIG. 8C where only the signal of the most advanced phase node B is "1" (high), (F,G,H)=(1,1,0) in the case of FIG. 8D where the signal of the next most advanced phase node B is "1", too, and (F,G,H)=(1,1,1) in the case of FIG. 8D where all signals of the nodes B to D are "1".

In the circuit configuration shown in FIG. 7, since the monitor circuit 23 as described above emulates the delay of the critical path of the semiconductor circuit, in the case of FIG. 8B where the signal at the output node B of the monitor circuit 23 is delayed from the reference, the supplied voltage is increased recognizing it to be clearly "too delayed". Only after the signal at the node C becomes "1" is the supplied voltage judged to be appropriate.

Therefore, the first buffer BF2-1 forming the delay element chain sets a margin delay which determines the lower limit of the appropriate delay range.

On the other hand, if the signal at node D becomes 1, the speed is recognized to be "too fast", that is, the voltage is judged to be excessively supplied and the supplied voltage is decreased. Therefore, the later buffer BF2-2 determines the upper limit of the appropriate delay range. This quantity of delay sets the size of the range.

Such control of the power supply voltage is actually performed by the power supply voltage control circuit 25 of FIG. 7. In this, the control circuit 26 decides the direction of change and amount of change of the power supply voltage based on the bit string output from the delay detection circuit 24 and showing the phase difference information.

For example, if the amount of change of the supplied voltage in the case of FIG. 8C is denoted as ΔV (increase), it is determined as 2ΔV (increase) in FIG. 8B and –ΔV (decrease) in FIG. 8E.

The information of change of the supplied voltage is sent to the power supply voltage generation circuit 27 as the control signal S.

Based on the received control signal S, the power supply voltage generation circuit 27 generates a new power supply voltage $V_{DD}'$ and switches the power supply voltage $V_{DD}$ supplied so far to the semiconductor circuit 21 including the monitor circuit 21 to the new power supply voltage $V_{DD}'$.

In the present invention, this switch is timed to after the necessity of the change of the power supply is confirmed. The necessity is confirmed for example by detecting the delay at least one more time.

As shown in the timing charts of FIGS. 8A to 8F, usually the delay detection circuit 24 detects the delay each time the pulse of the reference signal Se rises and changes the output bit string (F,G,H) according to the result.

Therefore, for example, it is possible to set as a condition of change of the power supply voltage that the same or same direction (direction of change of voltage) result be maintained in the consecutive monitoring sampling from the first to the m-th time.

In this example, since the sampling is periodic, it is necessary that at least the direction of voltage change be maintained the same in the results of delay detection within a certain time from when the instruction for changing the power supply voltage is first issued.

Figure 9:
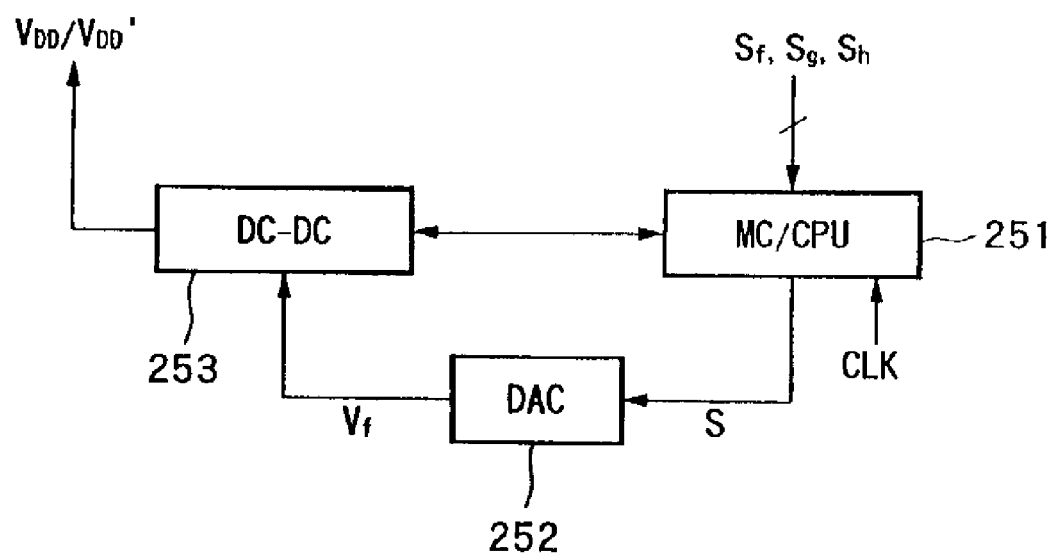
FIG. 9 is a block diagram of a concrete example of the configuration of a power supply voltage control circuit in the power supply voltage control apparatus according to the third embodiment.

FIG. 9 is a block diagram of a more concrete example of the configuration of the power supply voltage control circuit 25.

The power supply voltage control circuit 25 of the illustrated example, for example, includes a control circuit 251 such as a microcomputer or processor, a digital/analog (D/A) converter 252, and a DC—DC converter 253.

The control circuit 251 receives the output signals Sf, Sg, Sh of the delay detection circuit and outputs to the D/A converter 252 a digital signal (control signal S) instructing a change of the supplied voltage.

The D/A converter 252 converts the control signal S to an analog reference voltage Vr and outputs it to the DC—DC converter 253.

The DC—DC converter 253 converts the analog reference voltage Vr to a new power supply voltage $V_{DD}'$ and switches it with the power supply voltage $V_{DD}$ output until then at the specified timing mentioned above.

The control for switching the power supply voltage, together with the aforesaid confirmation of necessity, is performed by the control circuit 251.

The count value CNT of monitoring sampling is stored in a counter provided in the control circuit 251. The count value CNT is able to be suitably incremented. The control circuit 251 resets the count value CNT if change of the supplied voltage is not necessary or after the supplied voltage is changed. Further, the control circuit 251 constantly monitors the count value CNT and uses as one condition of change of the supplied voltage that the count value CNT reach a specified number m.

In this way, when the control circuit 251 is formed by a processor etc., the control of the power supply voltage, including the confirmation of necessity, can be set by a program and can be easily changed.

As described above, in this example, the delay margin and appropriate delay range are set by the amount of delay of delay elements in the delay detection circuit. These settings may also be made by the program however.

When the number of delay elements is large and the phase difference is finely detected, the delay steps of the delay elements can be made constant and the delay element chain can be simply used as a delay scale.

For example, in this case, the delay margin and appropriate delay range may be set by the serial number of the delay elements and/or number of gates in the program in the control circuit.

Further, as shown in FIG. 9, by combination with a DC—DC converter 253, the span of voltage change can be set in more diverse ways in accordance with the detected quantity in the delay scale.

Next, a detailed explanation will be made of the control of the power supply voltage with reference to the flow chart in FIG. 10 and FIGS. 11A to 11C, FIGS. 12A to 12C, and FIGS. 13A to 13C.

First, at step ST10, the count value CNT is reset in the control circuit 26, then at step ST11, the first pulse Sa is output from the pulse generator 221, then this is propagated in the monitor circuit 23 and delayed.

The delayed pulse Sb is input to the delay detection circuit 24, where the monitor delay is detected at step ST12.

That is, the signals Sb, Sc, Sd at nodes B, C, D of the delay element chain are fetched by the flip-flop FF1, FF2, FF3 at the rising timing of the reference signal Se delayed by one pulse width relative to the monitor input signal Sa and are output to the control circuit 26 as delay detection signals Sf, Sg, Sh.

The control circuit 26 receiving the delay detection signals Sf, Sg, Sh judges whether or not the monitor delay is within the appropriate range according to the bit string (F,G,H).

If the monitor delay is in the appropriate range, namely, the bit string is (1,1,0), at step ST13, either an instruction for maintaining the supplied voltage is issued from the control circuit 26 or no instruction is issued.

Then, after the count value CNT is reset (step ST10), the processing flow returns to before step ST11 to await the next pulse.

If the bit string is (1,1,1), it is judged that the signal propagation speed is too fast, whereupon the routine proceeds to step ST14. At step ST14, it is judged whether or not the count value CNT has reached a defined value m, for example 3. When the count value CNT has not reached the defined value m, because CNT=0 at the beginning, it is incremented in the next step ST15, and the processing flow returns to before step ST11.

The processing loop from step ST11 to step ST15 is repeated for each input of the reference pulse signal Se until it is found that CNT=m at step ST14.

If it is detected at step ST14 that CNT=m, for example, CNT=3, the processing flow proceeds to step ST16 where identity of the delay detection result is judged. This is for eliminating from the scope of change of the power supply voltage any fluctuation of the power supply voltage, due for example to noise, which returns naturally within a short time.

FIGS. 11A to 11C illustrate the case in which the necessity of change of the power supply voltage is confirmed, while FIGS. 12A to 12C illustrate the case where the necessity is not confirmed.

FIGS. 11A to 11C show the case in which the minimum required voltage for normal operation of the semiconductor circuit 21 falls for example because of a change in the ambient temperature. In this case, an excess voltage appears in the difference between the minimum required voltage and the actually supplied voltage. As a result, the speed is judged "fast" by the detection of the monitor delay. Therefore, three detection results become the same, identity of the detection results at step ST16 is confirmed, and at the next step ST17, the actually supplied voltage is decreased.

Then, after the count value is reset at ST10, the usual standby loop ST11 to ST12 to ST13 to ST10 is repeated until the next change of the minimum required voltage or fluctuation of the power supply voltage due to noise appears.

However, as shown in FIGS. 12A to 12C, if the power supply voltage rises due to superposition of positive noise on the power supply voltage, the signal propagation speed of the monitor circuit 23 rises for a while. In this case, the speed is also judged "fast" by the detection of the monitor delay.

For the control circuit 26, since the bit string of the delay detection signal is the same as that shown in FIGS. 11A to 11C, at the beginning stage, it does not differentiate between the case of FIGS. 11A to 11C and the case of FIGS. 12A to 12C.

However, fluctuation of the power supply voltage due to noise dies down within a very short time, so for example, the voltage is judged to be appropriate at the third delay detection. Due to this, the routine leaves the necessity confirmation loop ST11 to ST12 to ST14 to ST15 and proceeds to the standby loop ST11 to ST12 to ST13 to ST10. That is, processing for lowering the power supply voltage is not carried out.

FIGS. 13A to 13C show the case in which the minimum required voltage rises because of a change in the ambient temperature during the standby loop processing or consumption of the battery serving as the power supply.

In this case, the signal propagation speed of the monitor circuit is judged to be "slow", and the routine proceeds to the step ST18. At step ST18, the processing for increasing the supplied voltage is carried out directly without judging the necessity of voltage change. The reason is that if the minimum required voltage rises, the voltage margin with the supplied voltage decreases by that extent, so in order to prevent malfunctions it is helpful to shorten the state of a reduced margin as much as possible.

That is, if judgment of the necessity of change of the power supply voltage is performed, in this time period, the danger is high that the supplied voltage will fall below the minimum required voltage, so if the signal propagation speed is judged to be "slow", it is preferable to increase the power supply voltage by a sufficient amount at once.

Then, after the count is reset at ST10, the usual standby loop ST11 to ST12 to ST13 to ST10 is repeated until the next change of the minimum required voltage or fluctuation in the power supply voltage due to noise.

Note that it is not preferable to increase the power supply voltage too mach from the viewpoint of power consumption, but even in this case, the power supply voltage is controlled to an appropriate value immediately by the processing loop for decreasing the supplied voltage, so the power loss can be kept to a minimum.

In the present invention, in such control of the power supply voltage, the power supply voltage is not changed unrestrictedly. A limiter of the upper limit and/or the lower limit acts.

That is, for example, if the history of the change of the power supply voltage is stored in the control circuit 26, when a delay detection signal requesting a change of the power supply voltage near the upper or lower limit of the power supply voltage is generated from the delay detection circuit 24, if the control circuit 26 can predict that the result will be "out of the allowable range of the power supply voltage" by referring to the history of change of the power supply, it ignores the request or changes the power supply voltage up to the limit point of the allowable range of the power supply voltage.

By this, wild changes in the power supply voltage can be prevented.

As described above, according to the third embodiment, the critical path of the semiconductor circuit 21 is emulated using the monitor circuit 23 and the result used to keep the power supply voltage to a necessary minimum of the minimum required voltage plus a certain margin. Even if the minimum required voltage changes, the power supply voltage tracks it in the same way according to the change, so the power consumption is constantly kept to the minimum required level.

During the control of the power supply voltage, the control circuit 26 confirms the necessity of the change of the power supply voltage, then carries out the actual change only when it is necessary, so even if there is very short fluctuation of the power supply voltage due to noise etc., no unnecessary change of the power supply voltage is made.

FIGS. 14A to 14C show the operation of a comparative example (reproduction of conventional operation) skipping the processing for confirmation of necessity of the change of the power supply voltage for explaining this effect.

Figure 10:
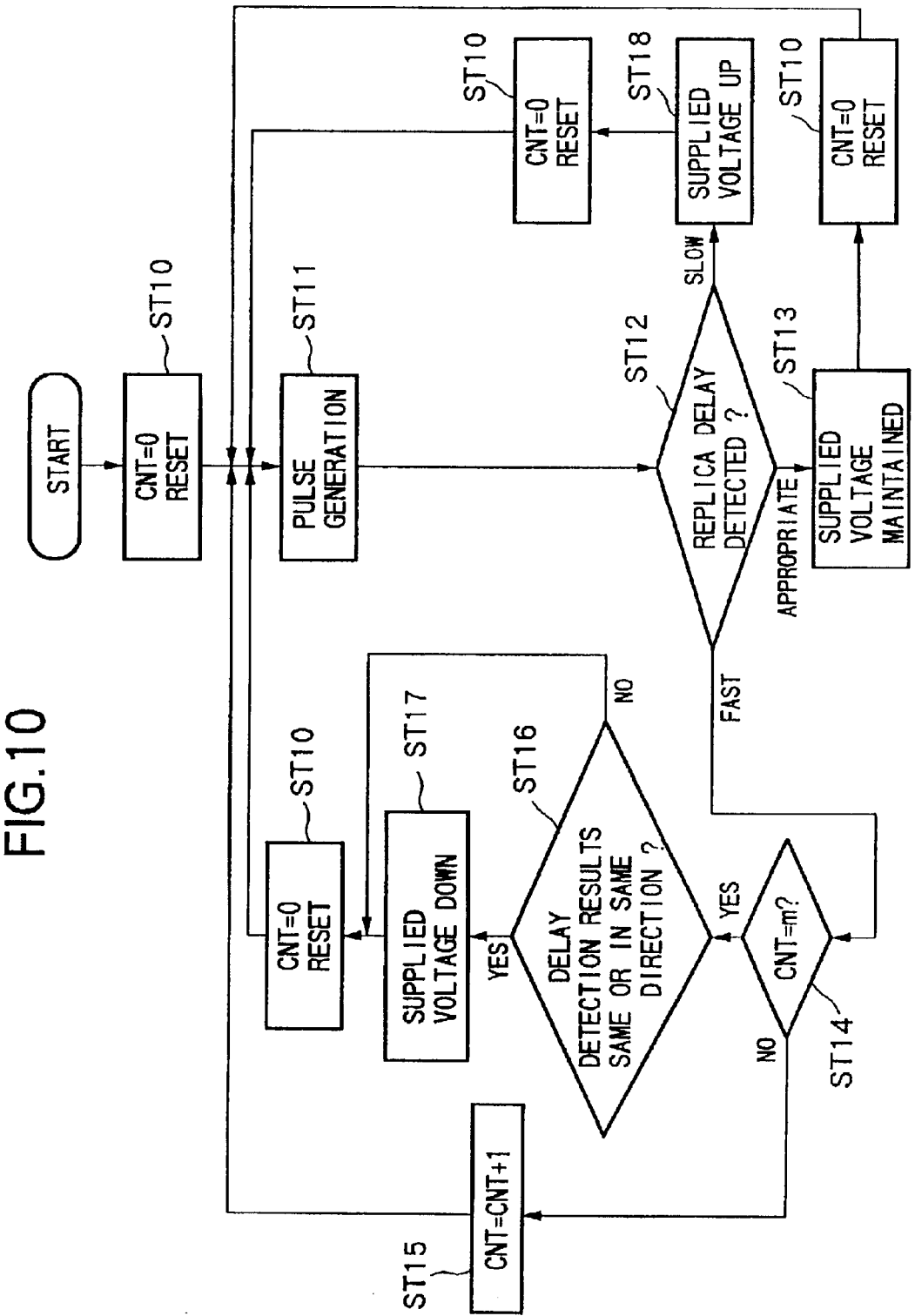
FIG. 10 is a flow chart showing the routine of power supply voltage control in the power supply voltage control apparatus according to the third embodiment.

When noise is superposed on the power supply voltage, the power supply voltage rises for a while and the signal propagation speed increases, so the speed is judged "fast" at step ST12 in FIG. 10. However, in this case, no processing for confirmation of necessity corresponding to step ST14 to ST16 in FIG. 10 is performed, so after the judgement at step ST12, the routine immediately proceeds to step ST17, where an instruction for decreasing the supplied voltage is issued.

However, it takes a certain amount of time after the instruction is issued until the supplied voltage actually decreases, so when actually trying to lower the supplied voltage, the fluctuation of the power supply voltage due to noise sometimes will die down and the signal propagation will return to the original value.

In this case, a command for returning the power supply voltage to its original state is issued by the monitor delay detection, but since feedback control takes a certain amount of time, the operation of decreasing the supplied voltage cannot be stopped and the processing ends up being carried out.

As a result, as shown in FIGS. 14A to 14C, due to the rebounding of noise, the power supply voltage is lowered for a while like an undershoot. If the decrease is large, the supplied voltage is liable to fall below the minimum required voltage. In this case, the probability of erroneous operation of the semiconductor circuit 21 will rapidly become higher.

In the third embodiment, as already mentioned in the FIGS. 12A to 12C, there are steps ST14 to ST16 for confirmation of necessity, so the advantage is attained that hasty execution of processing that may lead to erroneous operation can be forestalled and the stability can be raised by that extent.

Note that the power supply voltage cannot be lowered during steps ST14 to ST16 for confirmation of necessity, so there is that much wasteful power consumption, but the amount is negligible and does not hinder the advantage of introducing the monitor delay detection technique (low power consumption). Rather, there is a large merit that the stability of operation is improved and the reliability of the monitor delay detection technique is increased.

Fourth Embodiment

Figure 15:
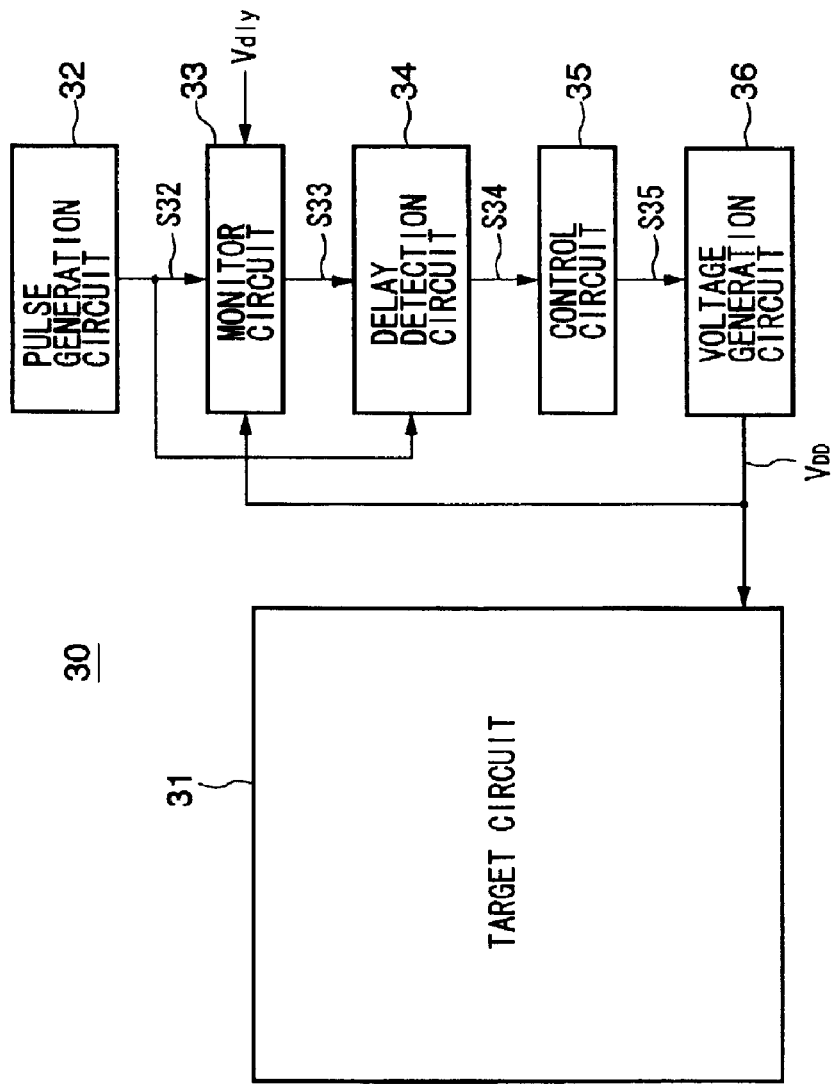
FIG. 15 is a block diagram of a semiconductor device according to a fourth embodiment.

FIG. 15 is a block diagram of an embodiment of a semiconductor device according to the present invention.

The semiconductor device 30, as shown in FIG. 15, includes a target circuit 31 to be monitored for delay characteristic, a pulse generation circuit 32, a monitor circuit 33, a delay detection circuit 34, a control circuit 35, and a voltage generation circuit 36.

The pulse generation circuit 32 generates a pulse signal S32 as a reference signal used for detecting the delay time between an input signal and an output signal in the monitor circuit 33 and outputs it to the monitor circuit 33 and the delay detection circuit 34.

Note that the pulses generated by the pulse generation circuit 32 may be for example one-shot pulses or periodic clocks.

The monitor circuit 33 has an oscillatable delay reference element, adds the delay of the delay reference element, and, when obtaining a sum value corresponding to a preset setting value Vdly, outputs the pulse signal S32 input from the pulse generation circuit 32, that is, delays the pulse signal S32 by a preset time and outputs it as the delayed signal S33, so as to give a desired delay characteristic equal or similar to that of the critical path inside the target circuit 31.

Figure 16:
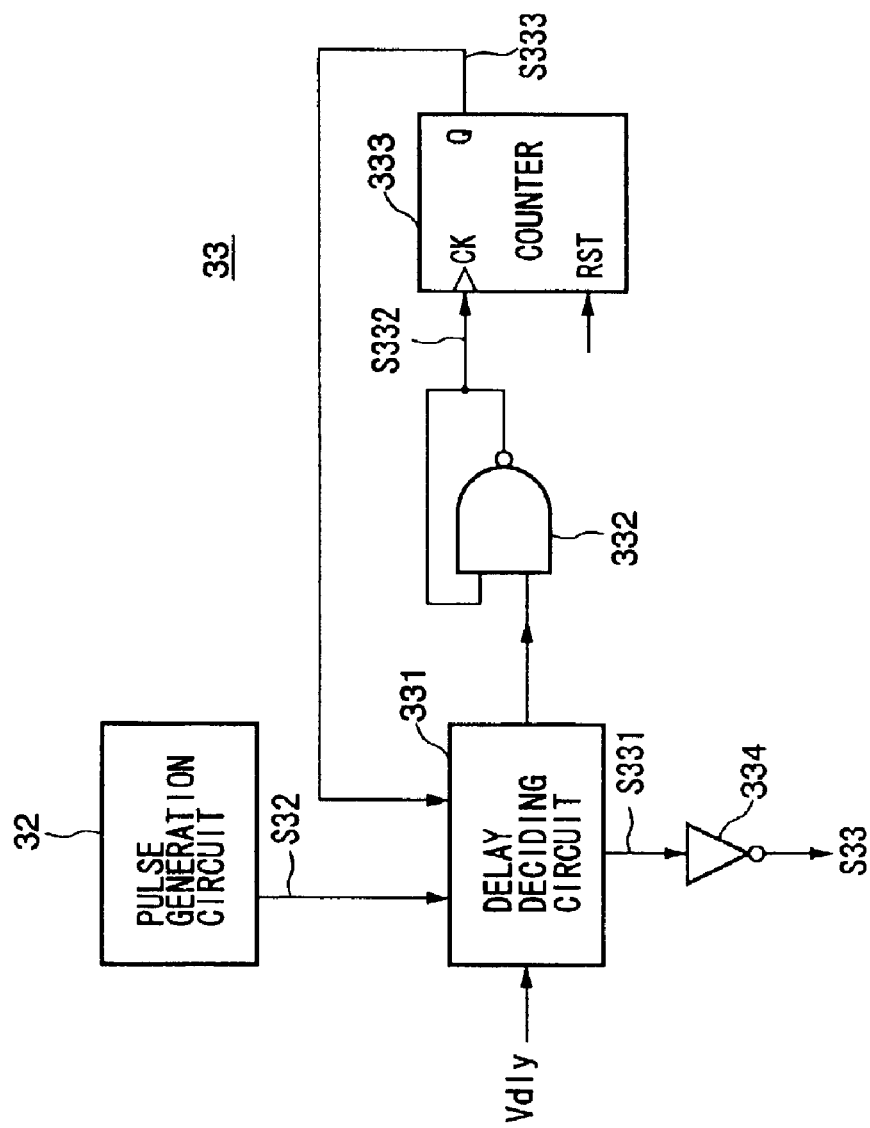
FIG. 16 is a block diagram of a concrete example of the configuration of a monitor circuit according to the fourth embodiment.

FIG. 16 is a block diagram of an example of the configuration of the monitor circuit 33.

The monitor circuit 33 has a delay deciding circuit 331, an oscillatable delay reference element 332, a counter 333, and an inverter 334.

The delay deciding circuit 331 receives as input the pulse signal S32 from the pulse generation circuit 32 and starts up at the time of input. For example, when the count of the counter 333 reaches the setting value Vdly preset in a not shown register, it generates a delayed signal S331 of a falling pulse width and outputs it to the delay reference element 332 and the inverter 334.

Figure 17:
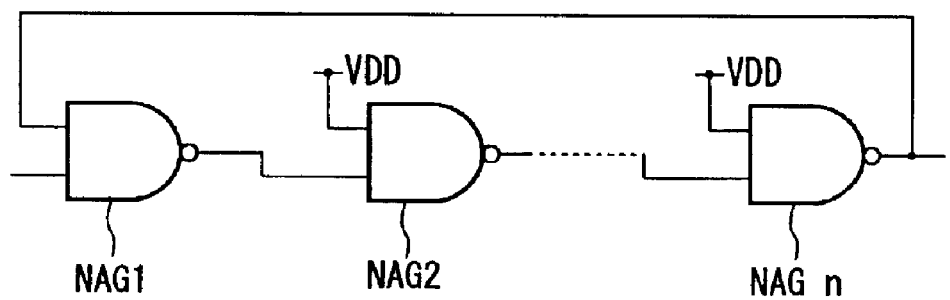
FIG. 17 is a view of an example of the configuration of the delay reference element in FIG. 16.

The oscillatable delay reference element 332, for example, as shown in FIG. 17, is comprised of n number of NAND gates NAG1 to NAGn connected in cascade in n stages so as to be oscillatable. It is configured as a so-called ring oscillator where one input terminal of the first NAND gate NAG1 receives a pulse signal S32 from the delay deciding circuit 331 and the output of the final NAND gate NAGn is input to the other input terminal of the first NAND gate NAG1, namely, they are connected in ring, and outputs an oscillation signal S332 having a certain period to the counter 333.

Further, one input terminal of each of the second to final NAND gates NAG2 to NAGn receives as input the output of the preceding NAND gates NAG1 to NAGn-1 respectively, while the other input terminal is connected to a power line for supplying the power supply voltage $V_{DD}$ from the voltage generation circuit 36.

The counter 333 receives as input the oscillation signal S332 output from the delay reference element 332 at its input terminal CK, counts the edges of the oscillation signal S332, and outputs the count value from its output terminal Q as a signal S333 to the delay deciding circuit 331. Then, because of the oscillatable configuration, the difference between two rising edges becomes a delay value of twice the delay reference element 332.

Further, the counter 333 cancels count clearing and reset for example before the operation of the delay reference element 333 is started.

Here, the "pulse width" of the delayed signal S331 generated by the delay deciding circuit 331 becomes several counts worth of delay of the delay reference element 332 (explained below), so by counting up by the counter 333, the delay value of delay reference element 332 is added.

The inverter 334 inverts the delayed signal S331 from the delay deciding circuit 331 and outputs it to the delay detection circuit 34 as the delayed signal S33.

Note that in the example in FIG. 16 and FIG. 17, the example is shown where the oscillatable delay reference element is formed by using NAND gates, but the present invention is not limited to this. Configurations using NORs or inverters or other composite gates are also possible.

The requirements for configuring the oscillatable delay reference element are that the counter 333 can detect it and that it be configured to oscillate including a gate delay component.

The delay detection circuit 34 detects the delay by comparing the delayed signal S33 output from the monitor circuit 33 and the pulse signal S32 from the pulse generation circuit 32 and outputs the detection result to the control circuit 35 as delayed data S34.

The control circuit 35 outputs to the voltage generation circuit 36 a control signal S35 instructing adjustment of the value of the power supply voltage to be supplied in accordance with the delayed data S34 of the detection result of the delay detection circuit 34.

For example, the control circuit 35 generates a control signal S35 to lower the voltage to make the detected delay value larger when the detected delay value is smaller than a preset delay value and to increase the voltage to make the detected delay value smaller when the detected delay value is larger than a preset delay.

The voltage generation circuit 36 adjusts (increases or decreases) the power supply voltage to a value according to the control signal S35 from the control circuit 35 and supplies it to the target circuit 31 and the monitor circuit 33.

Next, the operation of the above configuration will be explained with reference to FIGS. 18A to 18E and FIG. 19.

FIGS. 18A to 18E are timing charts of operation of the delay reference element.

Note that here, the desired count of the gate delay elements is set to for example 8 (delay value of the delay reference element×16).

In this case, the setting value Vdly given to the delay deciding circuit 331 is set to "8".

Then, the pulse generation circuit 32 generates the pulse signal S32 and supplies it to the monitor circuit 32 and the delay detection circuit 34.

The monitor circuit 32, first, as shown in FIGS. 18A and 18B, clears the counter 333 in synchronization with the rising edge of the pulse signal S32 from the pulse generation circuit 32 (ST21).

At this time, in the delay deciding circuit 331 as well, as shown in FIG. 18D, the signal S331 rises in synchronization with the rising edge of the pulse signal S32 (ST22). Then, the output signal S331 of the delay deciding circuit 331 is input to the delay reference element 332 and, as shown in FIG. 18C, the oscillation operation of the delay reference element 332 starts (ST23).

The oscillation signal S332 from the delay reference element 332 is supplied to the counter 333 where its rising edge is counted. The count value is supplied to the delay deciding circuit 331 as the signal S333.

Then, as shown in FIG. 18D, when the value of the counter 333 becomes "8", equal to the setting value Vdly, the signal S331 starts to fall (ST24). Along with the fall of the signal S331, as shown in FIG. 18C, the oscillation operation of the delay reference element 332 stops (ST25).

Finally, as shown in FIG. 18E, the output signal S331 of the delay deciding circuit 331 is inverted in the inverter 334, and the delayed signal S33 is output to the delay detection circuit 34.

The difference Tdiff between the rising edge of the pulse signal S32 from the pulse generation circuit 32 and the rising edge of the output signal S331 of the delay deciding circuit 331 (rising edge of the delayed signal S33) is the delay of eight gate delay elements (delay value of delay reference element×16) (sum of eight elements worth of delay).

The delay detection circuit 34 compares the delayed signal S33 from the monitor circuit 33 with the pulse signal S32 from the pulse generation circuit S32, detects the delay value of the delayed signal S33 relative to the pulse signal S32, and outputs the detection result to the control circuit 35 as the delayed data S34.

The control circuit 35 generates a control signal S35 instructing adjustment of the value of the supplied power supply voltage in accordance with the delay data S34 of the detection result of the delay detection circuit 34 and outputs it to the voltage generation circuit 36.

Then, the voltage generation circuit 36 adjusts (increases or decreases) the power supply voltage according to the control signal S35 from the control circuit 35 and supplies it to the target circuit 31 and the monitor circuit 33.

As described above, according to the fourth embodiment, since provision is made of a monitor circuit 33 which has an oscillatable delay reference element and a counter, adds the delay of the delay reference element, and, when obtaining a sum value corresponding to a preset setting value Vdly, outputs a pulse signal S32 as a reference signal input from the pulse generation circuit 32, that is, delays the pulse signal S32 by a preset time and outputs it as the delayed signal S33, it is possible to obtain a desired delay characteristic equal or similar to that of the critical path in the target circuit 31 and possible to approach closer to the configuration of the critical path of the target circuit 31 itself.

As a result, there is the advantage that the increase of the circuit scale can be kept to a minimum and more flexible and efficient design is possible.

Note that the fourth embodiment was configured to set the setting value Vdly given by the monitor circuit 33 into the delay deciding circuit 331, receive the count value in the counter 333, and compare it with the setting value to obtain the delayed signal, but the present invention is not limited to this. For example, a configuration in which a setting is given to the counter, the counter only counts a number corresponding to the setting value from the count value at that time and then outputs a signal, and the signal S331 is lowered upon receipt of this signal and other various configurations are also possible.

Figure 19:
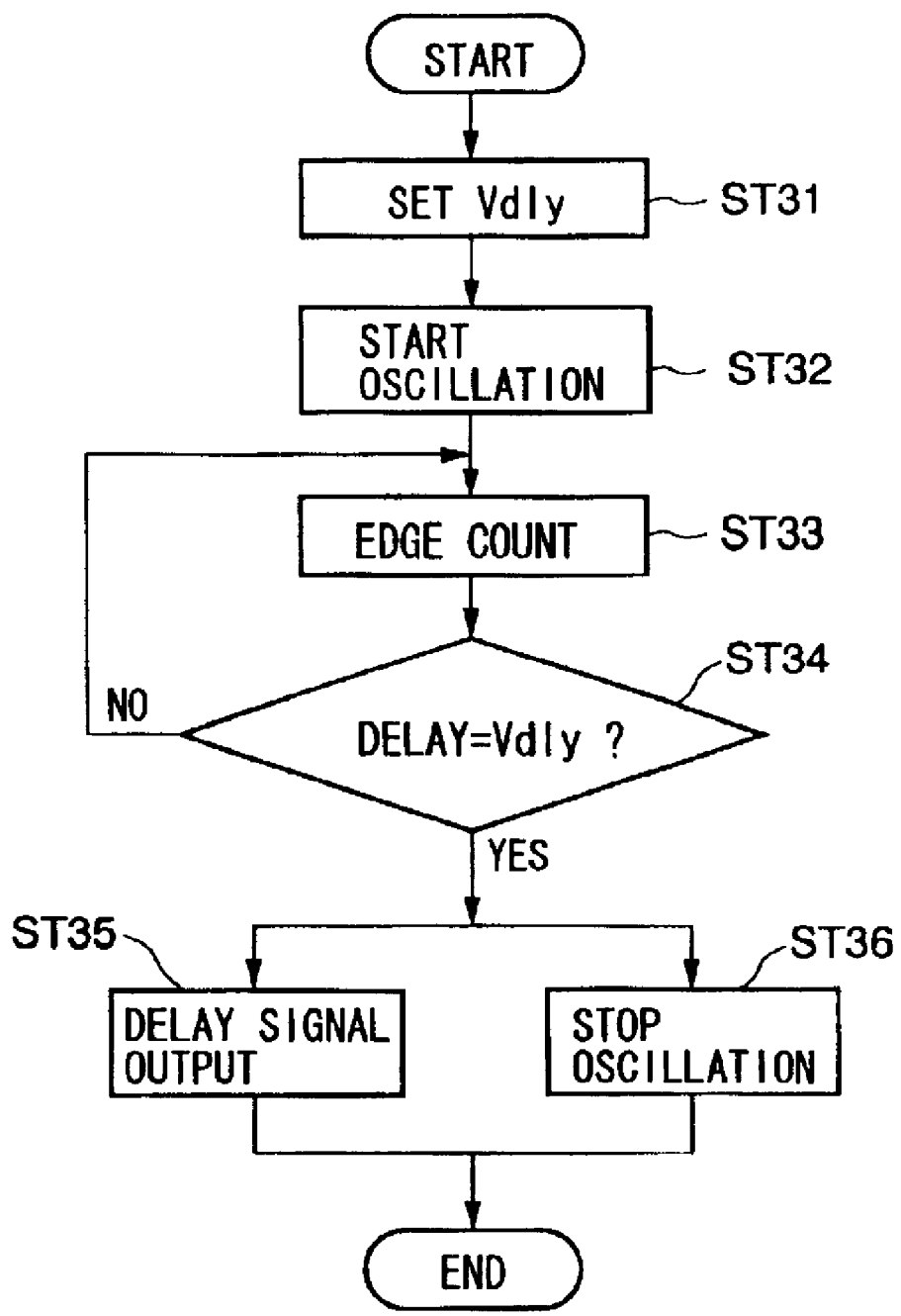
FIG. 19 is a flow chart for explaining the basic functions of a monitor circuit according to the fourth embodiment.

FIG. 19 is a flow chart illustrating the basic functions of the monitor circuit.

That is, as shown in FIG. 19, the monitor circuit 33 sets a desired setting value Vdly (ST31), initiates the oscillation operation of the delay reference element 332 in synchronization with the rising edge of the pulse signal S32 for example (ST32), and counts the edge of this oscillation signal by the counter 333 (ST33).

Then, when the count value reaches the setting value Vdly (ST34), it outputs the delayed signal S33 delayed exactly by the amount specified by the setting value of the delay reference element (ST35) and stops the oscillation operation of the delay reference element 332 (ST36).

Fifth Embodiment

Figure 20:
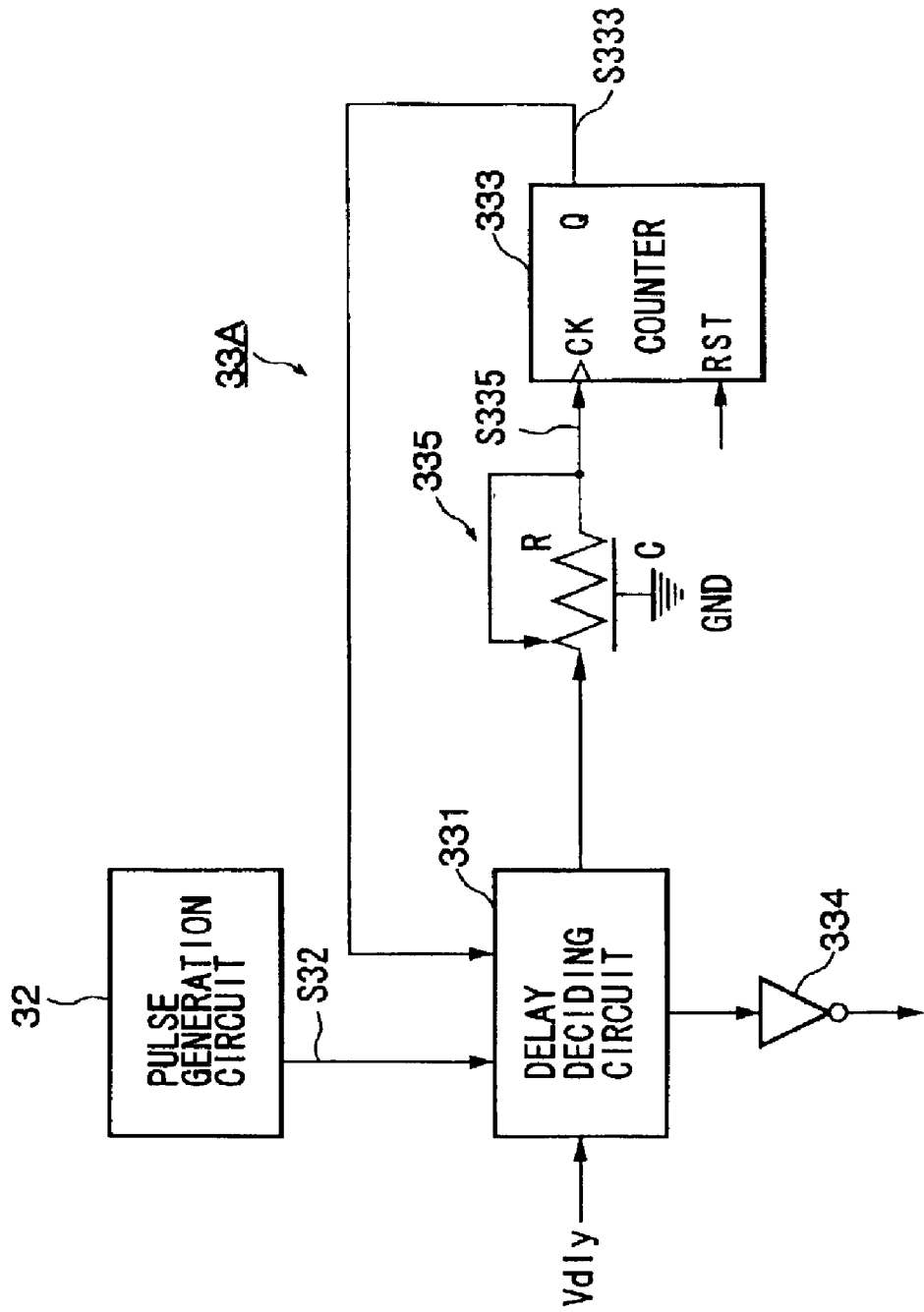
FIG. 20 is a block diagram of a semiconductor device according to a fifth embodiment and specifically shows another example of the configuration of a monitor circuit.

FIG. 20 is a block diagram of another embodiment of a semiconductor device according to the present invention. Note that, in FIG. 20, although only the principal portions, that is, a pulse generation circuit and a monitor circuit, are shown, in fact, for example, the pulse generation circuit and monitor circuit are used in a circuit as shown in FIG. 15.

In the fifth embodiment, the difference from the fourth embodiment shown in FIG. 16 is that in the monitor circuit 33A, the oscillatable delay reference element 335 is configured by RC delay elements instead of gate delay elements since gate delay components and RC delay components have different voltage and delay characteristic.

Aluminum wirings etc. are used for the RC delay elements 335.

Figure 21:
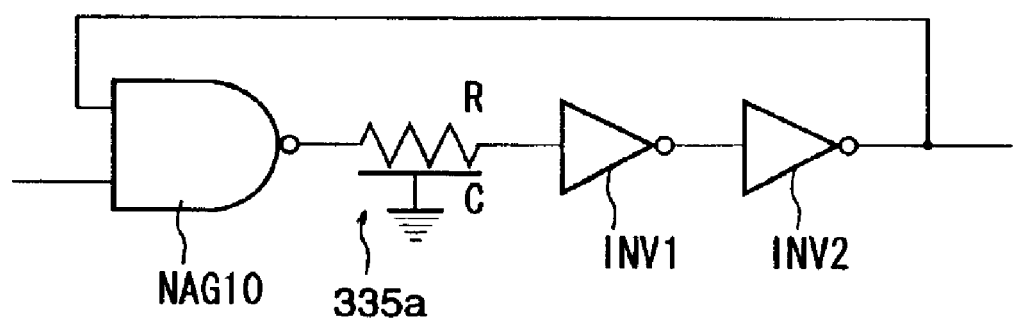
FIG. 21 is a view of an example of the configuration of a delay reference element in FIG. 20.

FIG. 21 is a circuit diagram of an example of the configuration of the delay reference element 335 in FIG. 20.

The delay reference element 335 is comprised of an NAND gate NAG10, a RC delay element 335a, and two inverters INV1 and INV2 connected in cascade. It is configured as a so-called ring oscillator wherein one input terminal of the first NAND gate NAG10 receives a pulse signal S32 from the delay deciding circuit 331 and the final inverter INV2 is input to the other input terminal of the first stage NAND gate NAG10, namely, they are connected in a ring, and outputs an oscillation signal S332 having a certain period to the counter 333.

Note that the requirements for the delay reference element 335 are that it can be detected by the counter 333 and it be configured to oscillate including an RC delay component.

The rest of the configuration and actions are similar to those of the fourth embodiment.

According to the fifth embodiment, similar effects to those of the fourth embodiment can be obtained.

Sixth Embodiment

Figure 22:
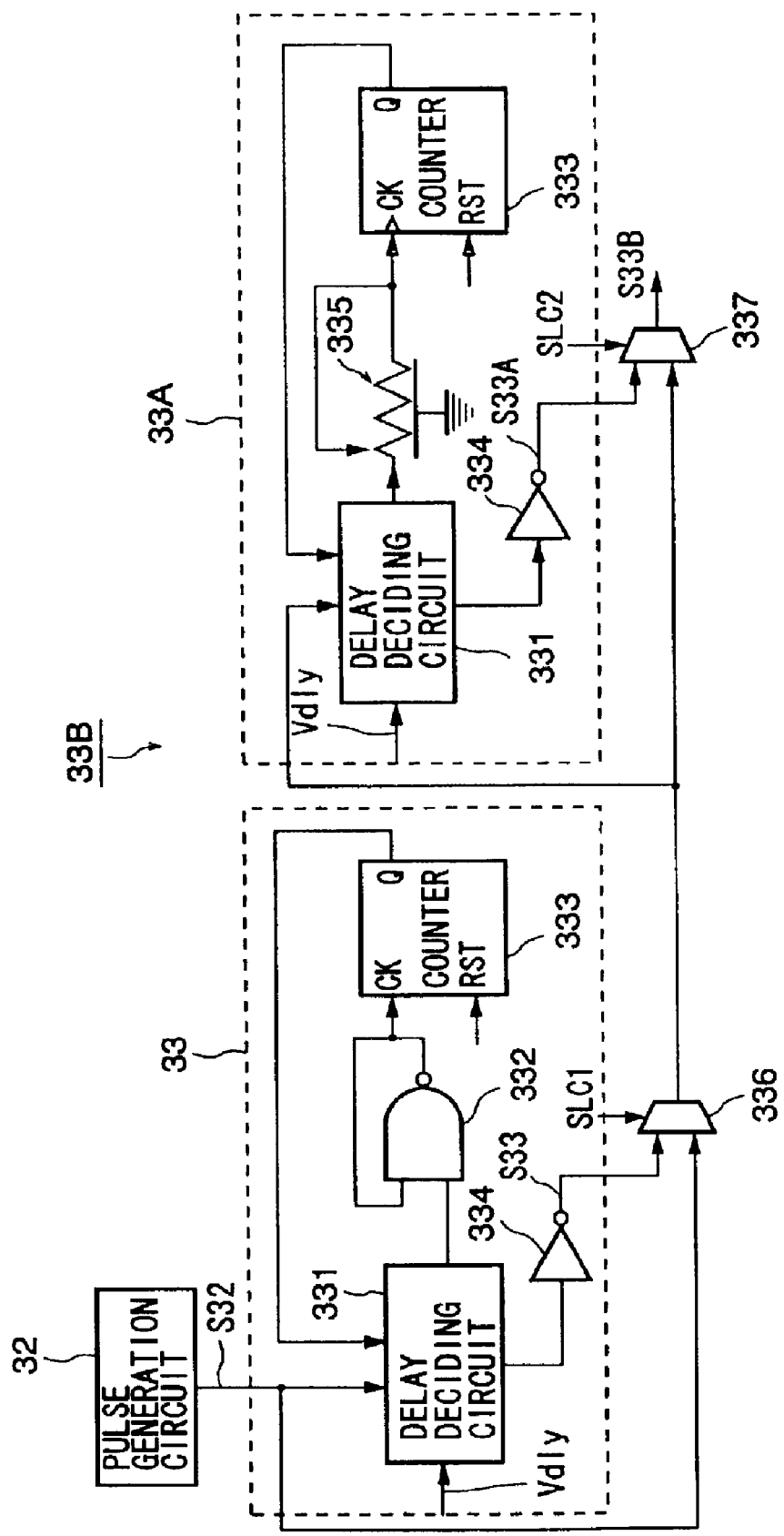
FIG. 22 is a block diagram of a semiconductor device according to a sixth embodiment and specifically shows another example of the configuration of a monitor circuit.

FIG. 22 is a block diagram of another embodiment of a semiconductor device according to the present invention. Note that, in FIG. 22, although only the principal portions, that is, a pulse generation circuit and a monitor circuit, are shown, in fact, for example, the pulse generation circuit and monitor circuit are used in a circuit as shown in FIG. 15.

In the sixth embodiment, the monitor circuit 33B is configured by connecting in series the monitor circuit according to the fourth embodiment as shown in FIG. 16 and the monitor circuit according to the fifth embodiment as shown in FIG. 20 as monitor units 33 and 33A to the output of the pulse generation circuit 32 and combining the gate delay component and the RC delay component to more closely approach the critical path of the target circuit 31.

Further, the monitor circuit 33B is supplied with a pulse signal S32 to the delay deciding circuit 331 of the first monitor unit 33.

The output delayed signal S33 of the first monitor unit 33 is supplied to the selector 336. The selector 336 is also supplied with the pulse signal S32, selects the pulse signal S32 or the output delayed signal S33 of the first monitor unit 33 by a select signal SLC1 from a not shown control system, and supplies the same to the delay deciding circuit 331 of the next monitor unit 33A or the selector 337.

The selector 337 is also supplied with the output delayed signal S33A of the monitor unit 33A, selects either the pulse signal S32 from the selector 336 or the output delayed signal S33 from the first monitor unit 33 or the output delayed signal S33A from the next monitor unit 33A by a select signal SLC2 from a not shown control system, and supplies the same to the delay detection circuit 34 (FIG. 15) as the delayed signal S33B of the monitor unit 33B.

In this way, since the monitor circuit 33B according to the sixth embodiment has the selectors 336 and 337, when the delay of the delay reference element is not necessary, it is possible to freely skip the delay reference elements of the gate delay component and the delay reference elements of the RC delay component.

According to the sixth embodiment, there is the advantage that it is possible to more closely approach the critical path of the target circuit and possible to keep the increase of the circuit scale to a minimum.

Further, it is possible to freely set the setting value set in the monitor unit 33 and the setting value set in the monitor unit 33A (for example, different values) and thereby possible to approach more closely the critical path of the target circuit.

Note that even the connection order of the monitor unit 33 and 33A is reversed, the same effects can be obtained.

Seventh Embodiment

Figure 23:
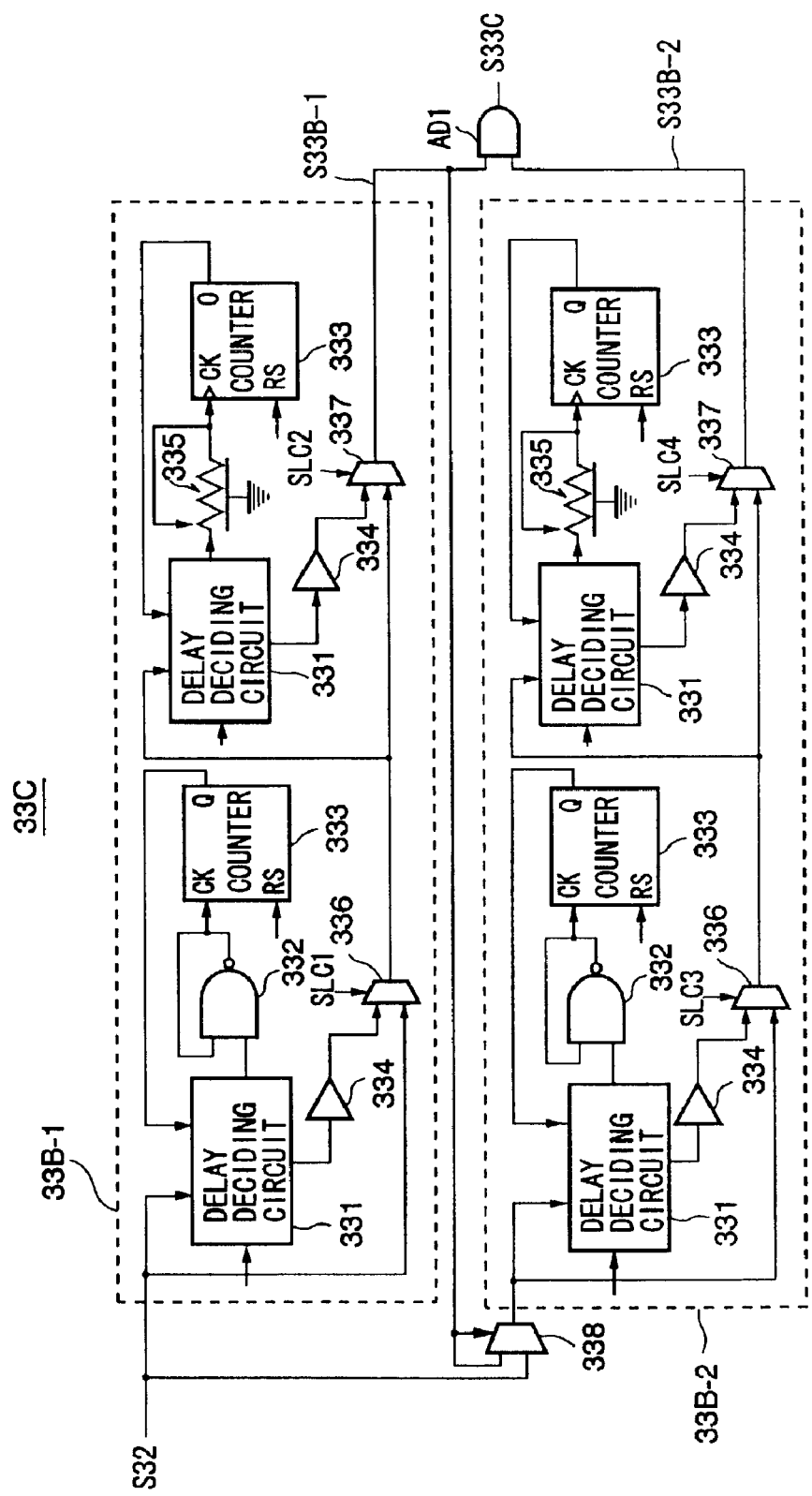
FIG. 23 is a block diagram of a semiconductor device according to a seventh embodiment and specifically shows another example of the configuration of a monitor circuit.

FIG. 23 is a block diagram of a semiconductor device of a seventh embodiment according to the present invention. Note that, in FIG. 23, although only the principal portion, that is, a pulse generation circuit, is shown, in fact, for example, the pulse generation circuit is used in a circuit as shown in FIG. 15.

The difference of the fourth embodiment from the sixth embodiment is that the monitor circuit 33C is configured by providing two monitor circuits 33B according to the sixth embodiment, connecting these monitor units 33B-1 and 33B-2 in parallel or in cascade to the input of the pulse signal S32 via the selector 338 serving as a connection selecting means, and obtaining a delayed signal S33C via the AND gate AD1 serving as a selecting means from the outputs of the two monitor units 33B-1 and 33B-2.

The AND gate AD1 that serves as the selecting means selects and outputs from the outputs of the plurality of monitor units the output signal of the delay element that has the larger amount of delay as a delayed signal S33 serving as a monitoring signal.

In such a configuration, when the pulse signal S33 serving as a monitor input is selected in the selector 338, the two monitor units 33B-1 and 33B-2 operate in parallel.

Such parallel operation is suitable for the following case.

That is, if the critical path of the target circuit 31 itself is changed due to the operating voltage, discontinuity occurs in the voltage and delay characteristic of the LSI.

In this case, it becomes difficult to obtain the optimal tracking of the voltage and delay characteristic of the target circuit 31 by one monitor circuit.

Therefore, the critical paths of the two provided monitor units 33B-1 and 33B-2 are combined to enable the optimal combination of the voltage and delay characteristics of the monitor circuits relative to the characteristic of the target circuit itself.

Further, when the output signal S33B-1 of the monitor unit 33B-1 is selected in the selector 338, the two monitor units 33B-1 and 33B-2 are connected in series (cascade) and operate as one monitor circuit.

Connection in series for operation as one monitor circuit is suitable for the following case.

That is, when the critical path of the target circuit 31 itself is configured as a gate+long wiring+gate+long wiring (for example, when repeater buffers are inserted between long wiring), by connecting the two monitor circuits in series and independently setting the number of gate delay elements and the number of RC delay elements in each monitor circuit, it is possible to make the monitor circuit closer to the configuration of the critical path of the target circuit 31 itself.

Further, it is possible to broaden the range of setting of the gate delay component and the RC delay component as much as twice.

As shown above, according to the seventh embodiment, in addition to the effects of the sixth embodiment described above, the effect can be obtained that it is possible to more closely approach the configuration of the critical path of the target circuit itself.

Eighth Embodiment

Figure 24:
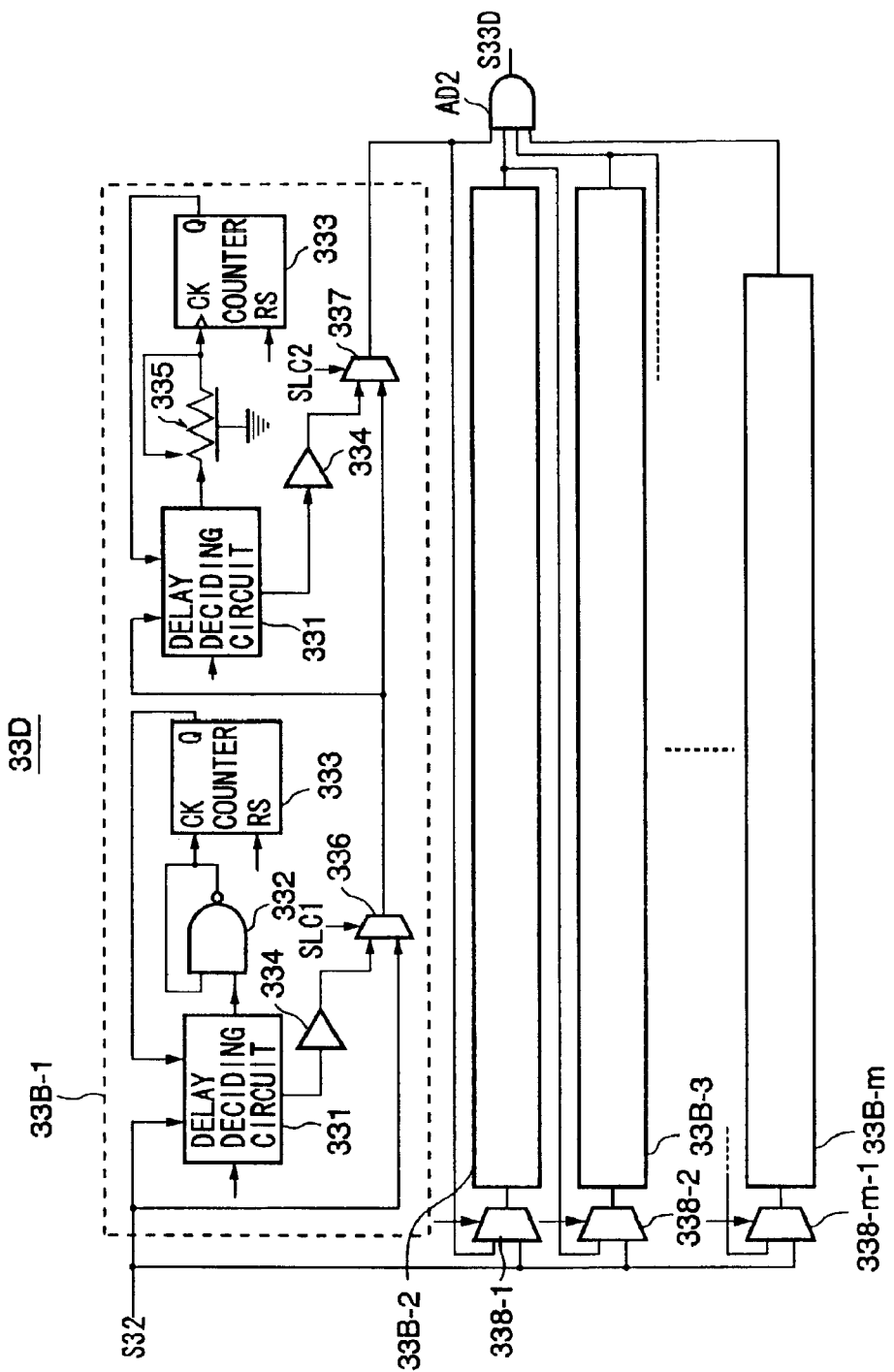
FIG. 24 is a block diagram of a semiconductor device according to an eighth embodiment and specifically shows another example of the configuration of a monitor circuit.

FIG. 24 is a block diagram of another embodiment of a semiconductor device according to the present invention. Note that, in FIG. 24, although only the principal portion, that is, a pulse generation circuit, is shown, in fact, for example, the pulse generation circuit is used in a circuit as shown in FIG. 15.

The monitor circuit according to the eighth embodiment differs from the monitor circuit according to the seventh embodiment in that the monitor circuit 33D is configured by using m (m≧3) monitor circuits 33B according to the sixth embodiment, connecting in series (cascade) these monitor units 33B-1 to 33B-m relative to the input of the pulse signal S32 via the selectors 338-1 to 338-$m$-1, operating them in parallel and/or operating them in series, and obtaining the delayed signal S33C as the monitor output via the m-input AND AD2 serving as a selecting means from the outputs of these monitor units 33B-1 to 33B-m.

According to the eighth embodiment, it is of course possible to obtain similar effects as those in the seventh embodiment described above and possible to construct a plurality of monitors comprised of a gate+long wiring+gate+long wiring and operate them in parallel to deal with a characteristic with discontinuity.

Further, in the present embodiment, because the delay elements forming the monitor circuit are comprised of detectable desired delay reference elements, even if a plurality of delay elements having different delay characteristics are formed, the increase of the size of the monitor circuit can be kept to a minimum compared with the usual multi-stage configuration.

Ninth Embodiment

Figure 25:
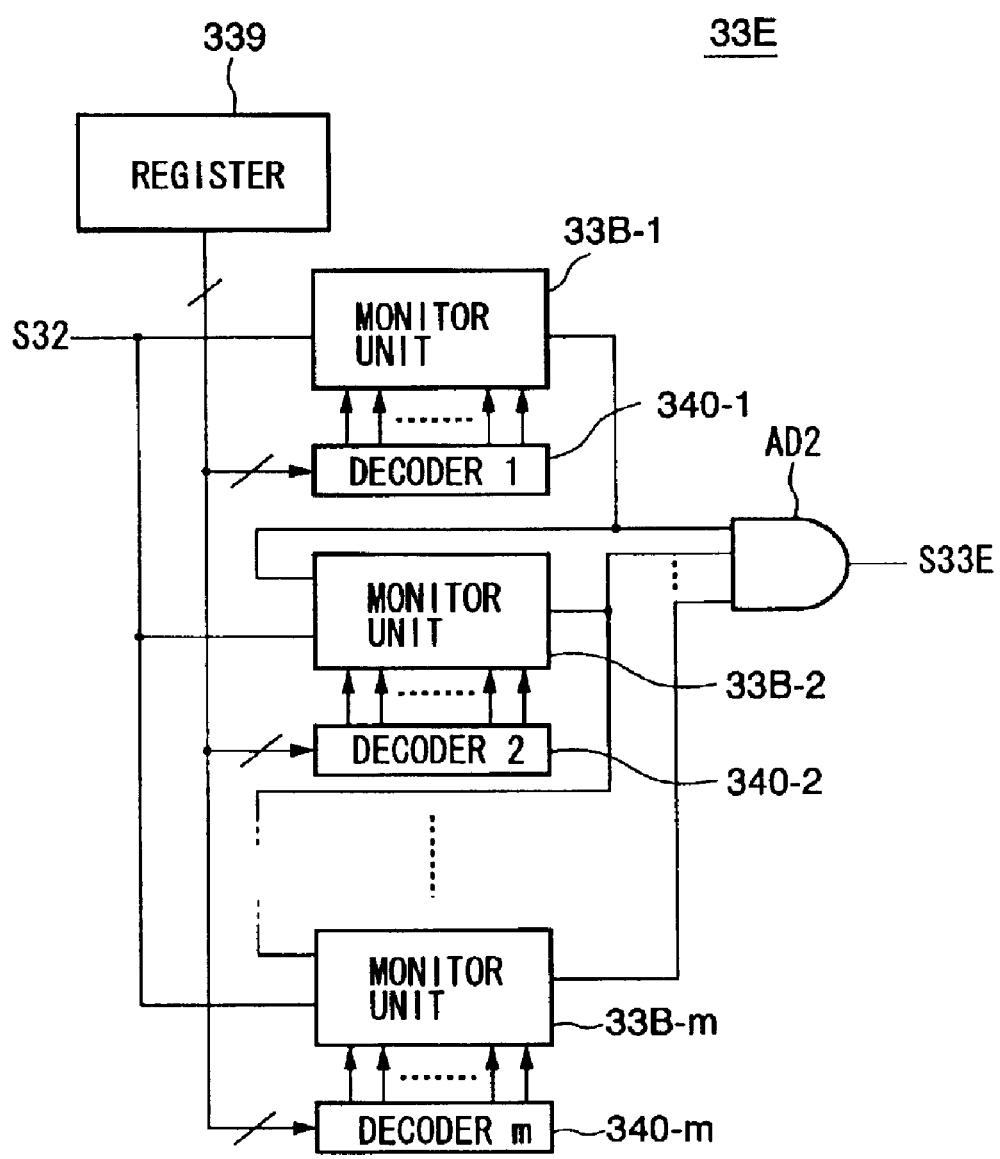
FIG. 25 is a block diagram for explaining a semiconductor device according to a ninth embodiment.
Figure 26:
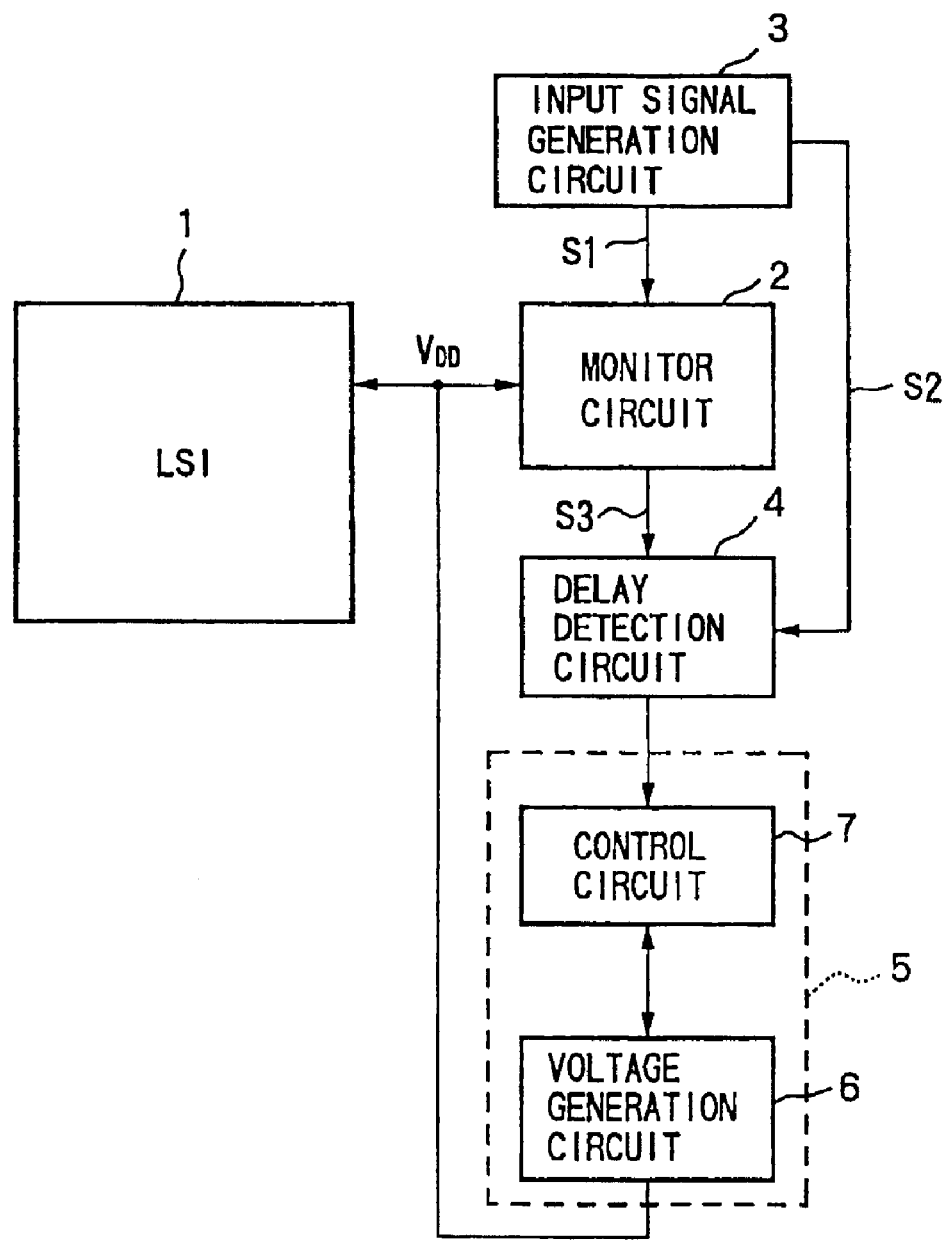
FIG. 26 is a block diagram of the configuration of a conventional power supply voltage control apparatus.
Figure 28:
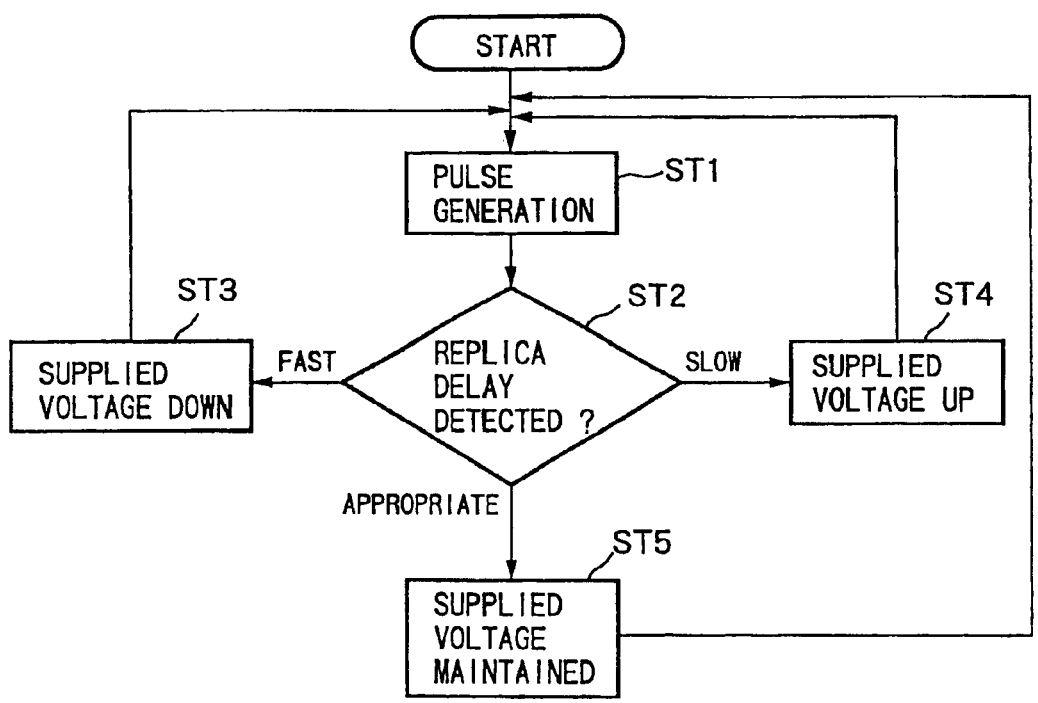
FIG. 28 is a flow chart showing the routine of control of the power supply voltage in a conventional power supply voltage control apparatus.

FIG. 25 is a view for explaining another embodiment of a semiconductor device according to the present invention and shows another example of the configuration of a monitor circuit forming the semiconductor device.

In the ninth embodiment, a concrete example is shown in which a group of adjustable monitor circuits can be set to a desired setting value Vdly after a chip is fabricated.

FIG. 25 is a circuit diagram of an example of the configuration enabling change of the delay value of the group of adjustable monitor circuits using a register.

As shown in the fourth to eighth embodiments described above, the settings of the number of delay elements or the methods of connection are selected by selectors, but in this circuit, they are set by the register 339.

The information set in the register 339 is decoded by decoders 340-1 to 340-$m$ provided corresponding to the monitor units 33B-1 to 33B-m and supplied to the selectors.

The register 339, for example, may be accessed directly by DMA from the outside or may be set by a certain control circuit inside.

Note that the delay value of the monitor circuit may also be set without using the register as shown in FIG. 25, for example, can also be controlled by setting signals of the outside pins.

Industrial Applicability

In the above way, according to the power supply voltage control apparatus according to the present invention, by using an input signal generation circuit of wide use, the load of design and development can be lessened. Further, an input signal and a reference signal can be generated for a broad use monitor circuit able to be electrically changed in delay. Therefore, due to the present invention, a broader use power supply voltage control apparatus suitable for various semiconductor circuits can be realized. In addition, by providing a characteristic between a power supply voltage and delay similar to the critical path of the semiconductor circuit and reducing the absolute value of the detected delay value, the size and area of the monitor circuit can be reduced. As a result, the cost of the power supply voltage control apparatus can be reduced. Furthermore, for example, even if there is a very short fluctuation in the power supply voltage caused by noise, the power supply voltage is not changed. Therefore, an unnecessary change of the power supply voltage due to a very short fluctuation of the power supply voltage and a fall of the power supply voltage supplied to the semiconductor circuit below the minimum required voltage can be effectively prevented. For this control, the change in the power supply voltage is delayed by exactly a few pulses worth of the clock, i.e., the time for confirming necessity, but there is only slight power loss due to this. The power consumption is far smaller than that of the conventional method in which a sufficiently large margin of power supply voltage to include the amount of fluctuation due to noise was set. Due to this, according to the present invention, it is possible to provide a power supply voltage apparatus that raises the stability of operation of the semiconductor circuit without hindering the effect of reduction of the power consumption.

Further, according to the semiconductor circuit of the present invention, it is possible to more closely approach the configuration of the critical path of a target circuit itself. As a result, there is an advantage that the increase of the circuit scale can be kept to a minimum and more flexible and efficient design is attainable. Further, the increase of the size of the monitor circuit due to the provision of a plurality of delay elements having different characteristics can be kept to a minimum.

What is claimed is:

1. A power supply voltage control apparatus, comprising:
   a semiconductor circuit having transmission paths and receiving a power supply voltage to operate,
   an input signal generation circuit able to change a phase difference of both signals in accordance with a control signal when generating a reference signal and an input signal from an input clock signal,
   a monitor circuit having a characteristic between a power supply voltage and delay equivalent to that of a critical path of the semiconductor circuit, receiving and propagating the input signal from the input signal generation circuit, and outputting a delayed signal to be delayed exactly by a time equivalent to delay of the critical path, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit.

2. A power supply voltage control apparatus as set forth in claim 1, wherein the clock signal is a drive clock signal of the semiconductor circuit.

3. A power supply voltage control apparatus as set forth in claim 1, wherein the input signal generation circuit includes a clock generation circuit for receiving as input the clock signal and outputting a first clock signal and a second clock signal having a predetermined phase difference relative to the first clock signal and a frequency division circuit for dividing the first clock signal from the clock generation circuit to generate the input signal and dividing the second clock signal to generate the reference signal.

4. A power supply voltage control apparatus as set forth in claim 3, wherein the frequency division ratios of the first clock signal and the second clock signal are equal.

5. A power supply voltage control apparatus as set forth in claim 3, wherein the clock generation circuit includes a PLL circuit having a ring oscillation circuit comprised of a plurality of delay elements connected in a ring shape and a selector for selecting and outputting signals appearing at connection nodes between delay elements of the ring oscillation circuit in accordance with an input control signal.

6. A power supply voltage control apparatus as set forth in claim 5, wherein the PLL circuit includes a frequency divider for dividing an output of the ring oscillation circuit by a predetermined frequency division ratio, a phase comparison circuit for comparing phases of a divided signal from the frequency divider and a reference frequency signal and outputting an UP signal or a DOWN signal according to the comparison result, and an oscillation control circuit for supplying a voltage to each delay element of the ring oscillation circuit so as to obtain a predetermined oscillation frequency based on the UP signal or DOWN signal from the phase comparison circuit.

7. A power supply voltage control apparatus as set forth in claim 6, wherein the oscillation control circuit includes a charge pump circuit driven by the UP signal or DOWN signal and a loop filter for extracting a direct current voltage component from an output of the charge pump circuit and supplying it to the delay elements.

8. A power supply voltage control apparatus as set forth in claim 1, further comprising a delay element connected to either the input side or the output side of the monitor circuit and adjustable in delay.

9. A power supply voltage control apparatus as set forth in claim 1, wherein the monitor circuit includes a plurality of delay elements connected in series and a selector for receiving as input a plurality of delay signals appearing at connection nodes between the delay elements and selecting and outputting signals having different amounts of delay from the critical path of the semiconductor circuit according to an input selection signal.

10. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit is able to change the phase difference of the input signal and the reference signal in accordance with an input control signal.

11. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit includes a clock generation circuit for receiving the clock signal and outputting a first clock signal and a second clock signal having a predetermined phase difference relative to the first clock signal, and a frequency division circuit for dividing the first clock signal from the clock generation circuit to generate the input signal and dividing the second clock signal to generate the reference signal.

12. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit includes a clock generation circuit for receiving the clock signal and outputting a first clock signal and a second clock signal having a predetermined phase difference relative to the first clock signal, and a frequency division circuit for dividing the first clock signal from the clock generation circuit to generate the input signal and dividing the second clock signal to generate the reference signal, and wherein the frequency division ratios of the first clock signal and the second clock signal are equal.

13. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit includes a clock generation circuit for receiving the clock signal and outputting a first clock signal and a second clock signal having a predetermined phase difference relative to the first clock signal, and a frequency division circuit for dividing the first clock signal from the clock generation circuit to generate the input signal and dividing the second clock signal to generate the reference signal, and wherein the clock generation circuit includes a PLL circuit having a ring oscillation circuit comprised of a plurality of delay elements connected in a ring shape, and a selector for selecting and outputting signals appearing at connection nodes between delay elements of the ring oscillation circuit in accordance with an input control signal.

14. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a chance of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit includes a clock generation circuit for receiving the clock signal and outputting a first clock signal and a second clock signal having a predetermined phase difference relative to the first clock signal, and a frequency division circuit for dividing the first clock signal from the clock generation circuit to generate the input signal and dividing the second clock signal to generate the reference signal, and wherein the clock generation circuit includes a PLL circuit having a ring oscillation circuit comprised of a plurality of delay elements connected in a ring shape, and a selector for selecting and outputting signals appearing at connection nodes between delay elements of the ring oscillation circuit in accordance with an input control signal, and wherein the PLL circuit includes a frequency divider for dividing an output of the ring oscillation circuit by a predetermined frequency division ratio, a phase comparison circuit for comparing phases of a divided signal from the frequency divider and a reference frequency signal and outputting an UP signal or a DOWN signal according to the comparison result, and an oscillation control circuit for supplying a voltage to each delay element of the ring oscillation circuit so as to obtain a predetermined oscillation frequency based on the UP signal or DOWN signal from the phase comparison circuit.

15. A power supply voltage control apparatus, comprising:

a semiconductor circuit having transmission paths and receiving a power supply voltage to operate, an input signal generation circuit for generating a reference signal and an input signal from an input clock signal, a monitor circuit having a characteristic between a power supply voltage and delay similar to that of a critical path of the semiconductor circuit, receiving and propagating the input signal from the input signal generation circuit, and outputting a similar type delayed signal having an absolute value of delay and a change of delay value relative to the power supply voltage smaller than those of the critical path by a predetermined ratio, a delay detection circuit for receiving the delayed signal from the monitor circuit and the reference signal from the input signal generation circuit to detect a delay of the delayed signal relative to the reference signal, and a power supply voltage control circuit for controlling the power supply voltage to be supplied to the semiconductor circuit and the monitor circuit based on a result detected by the delay detection circuit, and wherein the input signal generation circuit includes a clock generation circuit for receiving the clock signal and outputting a first clock signal and a second clock signal having a predetermined phase difference relative to the first clock signal, and a frequency division circuit for dividing the first clock signal from the clock generation circuit to generate the input signal and dividing the second clock signal to generate the reference signal, and wherein the clock generation circuit includes a PLL circuit having a ring oscillation circuit comprised of a plurality of delay elements connected in a ring shape, and a selector for selecting and outputting signals appearing at connection nodes between delay elements of the ring oscillation circuit in accordance with an input control signal, and wherein the PLL circuit includes a frequency divider for dividing an output of the ring oscillation circuit by a undetermined frequency division ratio, a phase comparison circuit for comparing phases of a divided signal from the frequency divider and a reference frequency signal and outputting an UP signal or a DOWN signal according to the comparison result, and an oscillation control circuit for supplying a voltage to each delay element of the ring oscillation circuit so as to obtain a predetermined oscillation frequency based on the UP signal or DOWN signal from the phase comparison circuit, and wherein the oscillation control circuit includes a charge pump circuit driven by the UP signal or DOWN signal, and a loop filter for extracting a direct current voltage component from an output of the charge pump circuit and supplying it to the delay elements.

16. A power supply voltage control apparatus, comprising:

a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the power supply voltage control circuit monitors the number of times and extent of changes of the power supply voltage, estimates from the result of the monitoring the power supply voltage after a change based on detection results received from the delay detection circuit when receiving such detection results, and does not change the power supply voltage if the estimate value of the power supply voltage is outside of preset power supply voltage range.

17. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the power supply voltage control circuit monitors the number of times and extent of changes of the power supply voltage, estimates from the result of the monitoring the power supply voltage after a change based on detection results received from the delay detection circuit when receiving such detection results, and changes the power supply voltage only up to the limit point of the power supply voltage range if the estimate value of the power supply voltage is outside of preset power supply voltage range.

18. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the delay detection circuit includes a delay time monitoring gauge for detecting a phase difference of the output signal of the monitor circuit relative to the reference signal, and the detection result output from the delay detection circuit includes an information of the phase difference, and the delay time monitoring gauge includes a delay element chain comprised of a plurality of delay elements connected in series.

19. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the delay detection circuit includes a delay time monitoring gauge for detecting a phase difference of the output signal of the monitor circuit relative to the reference signal, and the detection result output from the delay detection circuit includes an information of the phase difference, and the delay time monitoring gauge includes a delay element chain comprised of a plurality of delay elements connected in series and indicates the phase difference information by the amount of the delay elements.

20. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the delay detection circuit includes a delay time monitoring gauge for detecting a phase difference of the output signal of the monitor circuit relative to the reference signal, and the detection result output from the delay detection circuit includes an information of the phase difference, and the delay time monitoring gauge includes a delay element chain comprised of a plurality of delay elements connected in series and indicates the phase difference information by the amount of the delay of each delay element.

21. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the delay detection circuit includes a delay time monitoring gauge for detecting a phase difference of the output signal of the monitor circuit relative to the reference signal, the detection result output from the delay detection circuit includes an information of the phase difference, the delay time monitoring gauge includes a delay element chain comprised of a plurality of delay elements connected in series, and the delay detection circuit further includes a plurality of detection means for detecting whether or not signals output from taps between elements of the delay element chain are delayed relative to the reference signal.

22. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply voltages to be supplied to the semiconductor circuit and the monitor circuit, and wherein the delay detection circuit includes a delay time monitoring gauge for detecting a chase difference of the output signal of the monitor circuit relative to the reference signal, the detection result output from the delay detection circuit includes an information of the phase difference, and the power supply voltage control circuit decides the amount of change and direction of change of the power supply voltage based on the phase difference information included in the detection result, and monitors the number of changes of the power supply voltage, amount of change, and direction of change, estimates from the results of the monitoring the power supply voltage after change based on detection results received from the delay detection circuit when receiving such detection results, and does not change the power supply voltage if the estimate value of the power supply voltage is outside of preset power supply voltage range.

23. A power supply voltage control apparatus, comprising a semiconductor circuit having transmission paths and receiving a power supply voltage to operate, a monitor circuit having a characteristic between a power supply voltage and delay equivalent to that of a critical path of the semiconductor circuit, propagating an input signal, and outputting a delayed signal to be delayed exactly by a time equivalent to delay of the critical path, a delay detection circuit for receiving an output signal from the monitor circuit and a reference signal and detecting delay of the output signal relative to the reference signal, and a power supply voltage control circuit for confirming necessity of change of the power supply voltage based on a result detected by the delay detection circuit and changing the power supply Voltages to be supplied to the semiconductor circuit and the monitor circuit, and wherein the delay detection circuit includes a delay time monitoring gauge for detecting a phase difference of the output signal of the monitor circuit relative to the reference signal, the detection result output from the delay detection circuit includes an information of the phase difference, and the power supply voltage control circuit decides the amount of change and direction of change of the power supply voltage based on the phase difference information included in the detection result and monitors the number of changes of the power supply voltage, amount of change, and direction of change, estimates from the results of the monitoring the power supply voltage after change based on detection results received from the delay detection circuit when receiving such detection results, and changes the power supply voltage only up to the limit point of the power supply voltage range if the estimate value of the power supply voltage is outside of preset power supply voltage range.

* * * * *

UNITED STATES PATENT AND TRADEMARK OFFICE
CERTIFICATE OF CORRECTION

| | | |
|---|---|---|
| PATENT NO. | : 6,924,679 B2 | Page 1 of 1 |
| APPLICATION NO. | : 09/959997 | |
| DATED | : August 2, 2005 | |
| INVENTOR(S) | : Katsunori Seno et al. | |

It is certified that error appears in the above-identified patent and that said Letters Patent is hereby corrected as shown below:

Column 37:
Line 24, "undetermined" should read -- predetermined --.

Signed and Sealed this

Twenty-eighth Day of November, 2006

JON W. DUDAS
*Director of the United States Patent and Trademark Office*